(12) United States Patent
Hu et al.

(10) Patent No.: US 12,484,253 B2
(45) Date of Patent: Nov. 25, 2025

(54) METAL FEATURES OF A SEMICONDUCTOR DEVICE AND METHODS FOR FORMING THE SAME

(71) Applicant: Taiwan Semiconductor Manufacturing Company, Ltd., Hsinchu (TW)

(72) Inventors: Kuan-Kan Hu, Hsinchu (TW); Tsung-Kai Chiu, Hsinchu County (TW); Wei-Yen Woon, Taoyuan (TW); Szuya Liao, Zubei Hsinchu (TW); Ku-Feng Yang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 328 days.

(21) Appl. No.: 18/160,019

(22) Filed: Jan. 26, 2023

(65) Prior Publication Data

US 2024/0014282 A1 Jan. 11, 2024

Related U.S. Application Data

(60) Provisional application No. 63/384,587, filed on Nov. 21, 2022, provisional application No. 63/370,589, (Continued)

(51) Int. Cl.
*H01L 29/423* (2006.01)
*H01L 21/02* (2006.01)
(Continued)

(52) U.S. Cl.
CPC ... *H10D 30/6735* (2025.01); *H01L 21/02499* (2013.01); *H10D 30/6757* (2025.01); *H10D 64/017* (2025.01); *H10D 84/0167* (2025.01); *H10D 84/017* (2025.01); *H10D 84/0193* (2025.01); *H10D 84/038* (2025.01)

(58) Field of Classification Search
CPC .... H10D 84/038; H10D 30/797; H10D 30/43; H10D 64/021; H10D 30/014; H10D 62/151; H10D 62/822; H10D 62/121; H10D 84/85; H10D 88/00; H10D 64/666; H10D 84/0177; H10D 88/01; H01L 21/28562; H01L 21/76876; H01L 21/28088; B82Y 10/00
See application file for complete search history.

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

CN 101400824 A 4/2009
TW 202145569 A 12/2021
TW 202147623 A 12/2021

*Primary Examiner* — Elmito Breval
(74) *Attorney, Agent, or Firm* — Haynes and Boone, LLP

(57) ABSTRACT

A method is provided that includes depositing a catalyst layer along a surface of the opening and performing a selectivity enhancement process. The selectivity enhancement process alters a deposition rate of a metal component on at least one region of the catalyst layer. The metal component is deposited on the catalyst layer. Exemplary selectivity enhancement processes include a self-assembled monolayer (SAM), introducing an accelerator, and/or introducing a suppressor.

20 Claims, 33 Drawing Sheets

Related U.S. Application Data filed on Aug. 5, 2022, provisional application No. 63/367,684, filed on Jul. 5, 2022.

(51) Int. Cl.
*H10D 30/67* (2025.01)
*H10D 64/01* (2025.01)
*H10D 84/01* (2025.01)
*H10D 84/03* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2017/0204529 A1 | 7/2017 | Nian et al. |
| 2018/0372665 A1 | 12/2018 | Huang et al. |

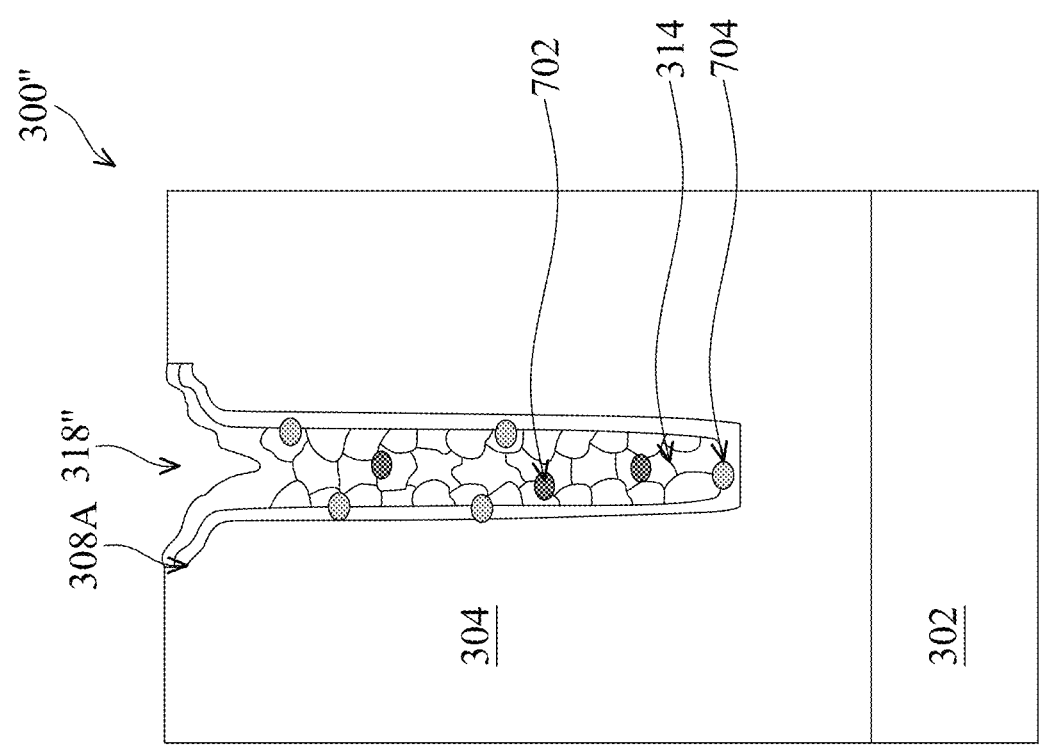

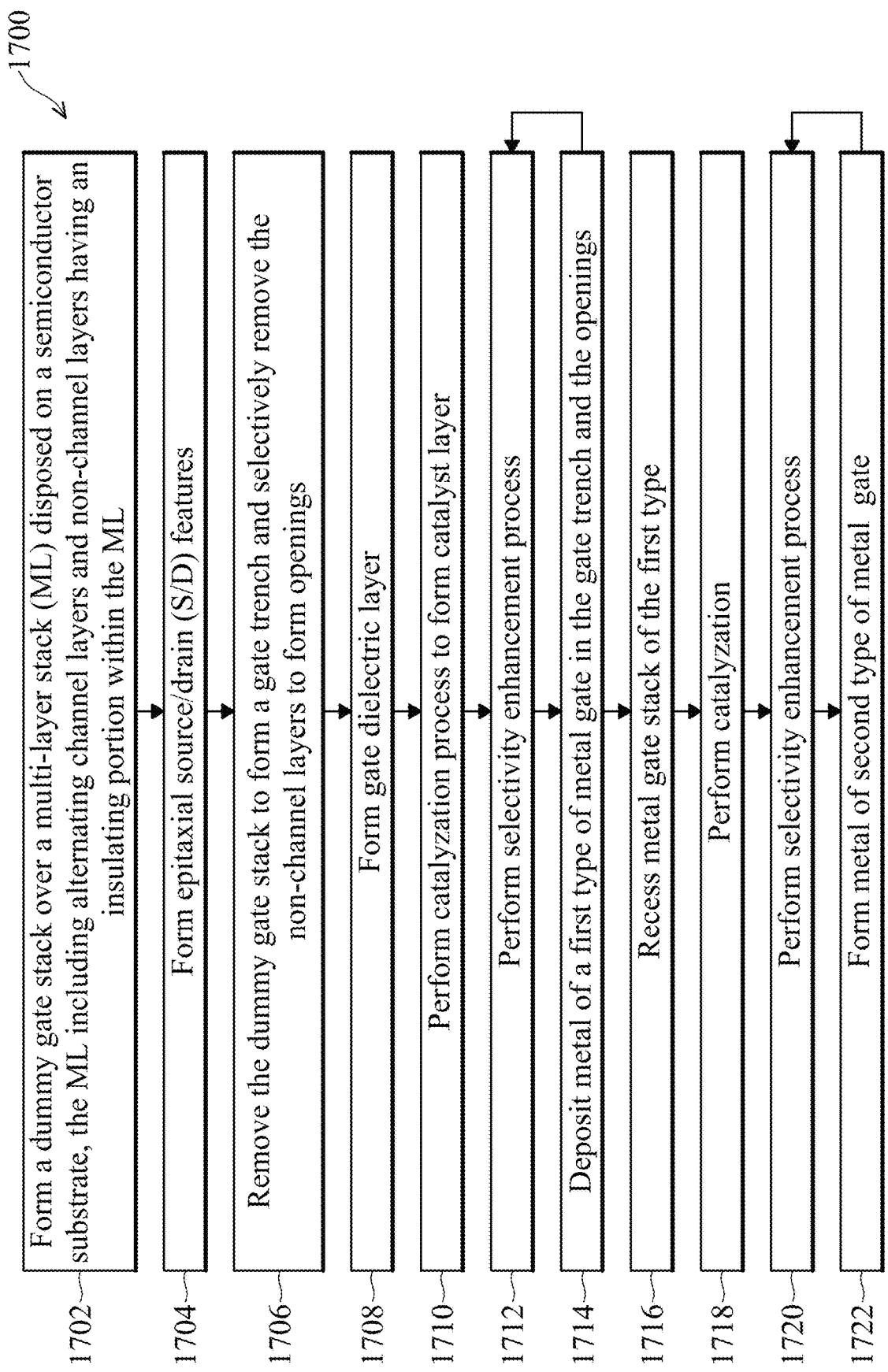

METAL FEATURES OF A SEMICONDUCTOR DEVICE AND METHODS FOR FORMING THE SAME

PRIORITY DATA

This application claims priority to U.S. Provisional Patent Application No. 63/367,684, filed on Jul. 5, 2022, U.S. Provisional Patent Application No. 63/370,589, filed on Aug. 5, 2022, and U.S. Provisional Patent Application No. 63/384,587, filed Nov. 21, 2022, the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, as features are scaled down, processing to form said features becomes more and more challenging. For example, a need for high aspect ratio features raise challenges such as in filling high-aspect ratio trenches with metallization to form high-aspect ratio metal features.

In addition of the advances through scaling down, transistors are provided in a variety of configurations beyond planar transistors, such as fin-type field effect transistors (FinFET) and nano-sheet devices including a plurality of vertically spaced-apart sheets of semiconductor material where the gate structure of the device is positioned around the sheets (e.g., gate-all-around (GAA) devices), which are introduced to meet the modern performance and chip area requirements. Nano-sheet devices can provide benefits such as operation at low voltage and high-speed with lower-power consumption. One example of a GAA technology introduced to meet ever increasing transistor density requirements is a complementary field-effect transistor (CFET), which includes nFET and pFET nano-sheet transistors stacked vertically over the substrate.

Thus, complex device configurations and/or aggressive scaling in fabrication technologies drives a desire for methods and devices suitable for small and/or complex geometric structures of a high quality.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4A, 4B, 5A, 6A, 5B, 6B, 7A, 7B and 7C illustrate a fragmentary cross-sectional view of a structure during various fabrication stages in the method of FIG. 2, according to one or more aspects of the present disclosure.

FIG. 17 illustrates a flow chart of an exemplary method for forming another semiconductor structure including a metal component (e.g., a metal gate) of a complementary field effect transistor (CFET), according to one or more aspects of the present disclosure.

DETAILED DESCRIPTION

Figure 1:
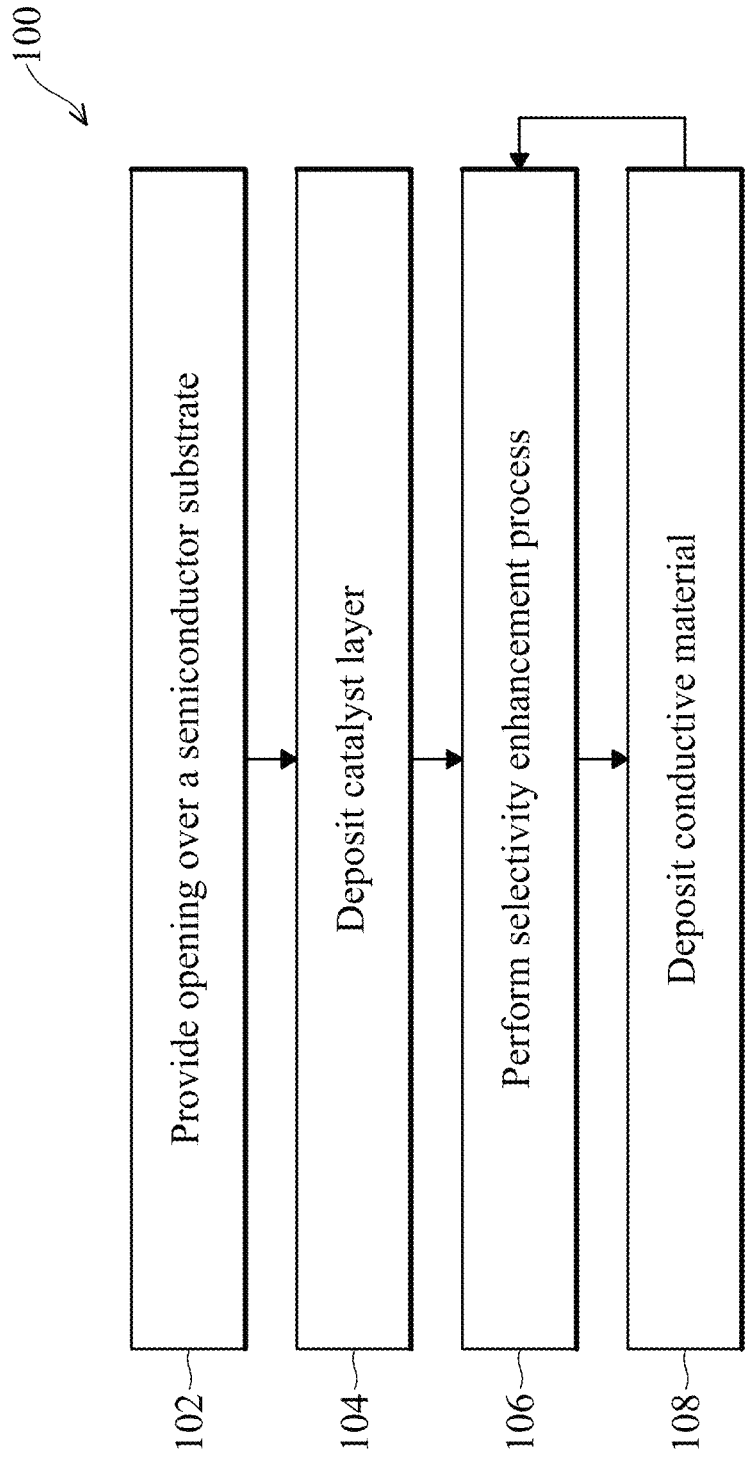
FIG. 1 illustrates a flow chart of an embodiment of a method for forming a conductive component of a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

As integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. The GAA transistor technology is extended to form complementary field effect transistors (CFETs), which in some implementations provide two different transistor types (nFET, pFET) vertically stacked, thereby decreasing the active area footprint. Some embodiments of the present disclosure relate to these devices.

During semiconductor device fabrication various processes are formed that require deposition of metallization in a constrained region such as a trench or opening. In filling the openings, especially those with high aspect ratios, it can be difficult to maintain quality and/or uniformity of metallization throughout the opening. The quality and/or uniformity of the metallization can affect the performance (e.g., increasing resistance) and in some implementations, for example, where the filled metallization must be subsequently etched back, a non-uniform metallization fill can affect the uniformity of the subsequent processes. For example, etching back a non-uniform metallization layer in a trench or opening can create a varied etch profile (e.g., etching back different amounts at different portions of the layer).

Filling openings with metallization is used at various stages of semiconductor device fabrication, including for example, forming interconnect features (e.g., contacts, lines, vias) and metal gate structures. For example, to balance the threshold voltages of CMOS devices, different gate materials are typically used for PMOS versus NMOS devices. The gate materials are generally formed using a replacement gate process that removes a placeholder material to form an opening, and within the opening the desired gate materials (e.g., metal gates) are formed. Due to the space constraints associated with nano-sheet devices, challenges to implement a replacement gate process to form different gate materials in the opening in a GAA device increases. These challenges extend yet further in CFET configurations. For example, when forming a CFET having a GAA transistor configuration, in some implementations, a replacement gate process is performed to form an opening, and two different types of metal gates must be formed in a vertically stacked fashion within the opening. Implementations of this are discussed below, which include processes that can demand multiple fill and etch back processes.

Aspects of the present disclosure relate to forming a metallization feature in an opening, which may be applicable to various fabrication steps and/or various device configurations. The terms "opening" and "trench" are used interchangeably in the present disclosure unless noted otherwise. Similarly, when forming a metal layer, terms "deposition" and "growth" of the metal layer are used interchangeability in the present disclosure unless noted otherwise.

The various aspects of the present disclosure will now be described in more detail with reference to the figures. In that regard, FIG. 1 is a flowchart illustrating method 100 of forming a structure of a semiconductor device according to embodiments of the present disclosure. Method 200, method 800 and method 1700 each provide an exemplary implementation of the method 100 of FIG. 1. However, those of ordinary skill in the art will appreciate other implementations are also possible.

The method 100 begins at block 102 where an opening over a semiconductor substrate is provided. In an embodiment, the substrate is a silicon substrate (e.g., including bulk single-crystalline silicon). The substrate may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate may be a semiconductor-on-insulator substrate, such as a silicon-on-insulator (SOI) substrate, a silicon germanium-on-insulator substrate, or a germanium-on-insulator substrate. The substrate may include n-type doped region(s) and p-type doped region(s). In an embodiment, the opening is formed in the substrate. In other embodiments, the opening is formed in a layer or layers formed over the substrate. The layers may include various insulating, semiconductor, and/or conducting layers. Exemplary insulating layers within which an opening may be formed include materials such as, for example, silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), titanium nitride (TiN), other low-k dielectrics, TiAlC, $HfO_2$, $TiO_2$, SiCN, SiCO, SiCON, other high-k dielectrics, various metal oxides, and/or other suitable materials.

The opening formed over the substrate may also be referred to as a trench or a slot. In an embodiment, the opening has an aspect ratio such that its height or depth is greater than its width. In an embodiment, the height/depth is measured perpendicular to a top surface of the substrate, and the width is measured perpendicular to the height/depth and parallel to a top surface of the substrate. In some implementations, the opening may be defined by a bottom surface and opposing sidewall surfaces extending from the bottom surface. In other implementations, the opening may not include a bottom surface or have a bottom surface of a different material, for example, as provided in an opening to be formed into a through substrate via (TSV). In some implementations, the sidewalls of the opening are tapered. In some implementations, the sidewalls of the opening vary in width from one another. As but one example, a dual damascene opening includes a first portion (e.g., metal line) having sidewalls of a first width apart and a second portion (e.g., via) having sidewalls of a second width apart. In some implementations, the opening is of various geometric shapes such as discussed below with reference to FIG. 28. This is to say that the opening provided in block 102 may be of various geometric structures and sizes, and is not limited except as specifically recited in the claims that follow.

The method 100 includes block 104, which provides for depositing a catalyst layer along one or more of the surfaces of the opening such as, the sidewall surfaces and/or bottom surface of the opening. The catalyst layer may be formed directly on the surfaces of the opening, or the catalyst may be formed on a layer(s) disposed on the surfaces. In an embodiment, the catalyst layer is conformally deposited on the trench surfaces. Exemplary deposition methods suitable to provide a conformal catalyst layer include atomic layer deposition (ALD), chemical vapor deposition (CVD), electroless deposition (ELD), pulsed laser ablation deposition (PLAD), and/or the suitable methods. In an embodiment, the catalyst layer is non-conformally deposited on the trench surfaces. Exemplary deposition methods suitable to selectively deposit a catalyst layer include physical vapor deposition (PVD), ion implantation, and/or the suitable methods. In some implementations, the catalyst is non-conformally formed along the surfaces of the opening such that it is disposed at a bottom surface and portions of the sidewall surfaces may include less or nor catalyst layer.

In an embodiment, a material of the catalyst layer (comprised of catalyst material) is selected from columns 8 to 12 of the periodic table. In further embodiments, exemplary catalyst materials include Pt, Pd, Co, Ru, Rh, Ag, Au, Cu, Ni, and/or other suitable materials. In an embodiment, the catalyst material is Pd. In an embodiment, the catalyst material is Ru. Exemplary thicknesses of the catalyst layer include 0.5 nanometers (nm) to 10 nm.

The method 100 includes block 106 where a selectivity enhancement process is performed. In some implementations, block 106 precedes block 108. In some implementations, block 108 of method 100 may be performed concurrently with block 106. In some implementations, block 106 and block 108 of the method 100 are performed iteratively. The selectivity enhancement process of block 106 is provided to control the deposition or growth of the metallization of block 108. In some implementations, the selectivity enhancement process is suitable to limit the deposition of the metallization at one or more regions of the opening (e.g., at one or more regions of the surfaces of the opening). For example, the selectivity enhancement process may provide for bottom-up deposition of the metallization (e.g., providing a greater deposition rate of the metallization at the bottom of the opening than an upper sidewall). As another example, the selectivity enhancement process may provide for super-conformal growth or deposition of the metallization (e.g., providing greater thickness of metallization at the bottom of the opening than an upper sidewall). As discussed below, in some implementations, bottom up growth or super-conformal growth can avoid forming seams or voids in the metallization when filling an opening.

In an embodiment, the selectivity enhancement process includes introducing an accelerator. The accelerator is provided to enhance metal deposition rate by providing extra electrons into a reaction of the metal deposition. The accelerator may be bis-(3-sodiumsulfopropyl) disulfide (SPS). In an embodiment, the accelerator alternatively or additionally includes SPS reduced monomer of 3-mercaptopropylsulfonate (MPS). SPS and MPS are shown in salt form below.

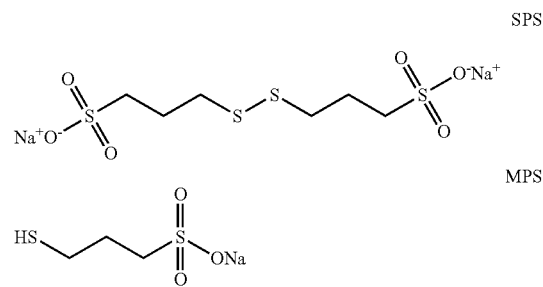

SPS may have a molecular weight of approximately 354.4 g/mol. MPS may have a molecular weight of approximately 178.2 g/mol. SPS and/or MPS are introduced by chemical vapor deposition (CVD), atomic layer deposition (ALD), and/or other suitable deposition methods.

The presence and effect of the accelerator is described in the series of reactions described below. However, it is noted that the disclosure provides this description for reference only and is not limited to this formation and/or reactions.

In an implementation, a sulfonic functional group (R—$SO_3$) and the sulfur-sulfur disulfide bond ("S—S") in a disulfide group of SPS and/or the thiol (R—SH) group in MPS can provide for the acceleration mechanism of the later deposited metal of block 108. For example, in a case of copper deposition, copper has affinity for sulfur "S" and the (—C—S—S—C—) portion of the molecule may interact with a copper formed on a surface of the opening and result in strong adsorption. While introduced to the copper surface, SPS and MPS form Cu (I) thiolate species that eventually is reduced to Cu.

A series of reactions thought to be provided by the introduction of SPS/MPS is provided in Equations 1, 2, 3 below. MPS, a dissociated product of SPS, converts to SPS with the reductive reaction from $Cu^{2+}$ to $Cu^+$ by reaction with the MPS ions (Equation 1). The SPS in turn can decompose forming 1,3-propane disulfonic acid (PDS) and MPS generated by the reduction of SPS (Equation 2 and 3). By the reactions (Equation 2 and 3), SPS continuously converts to MPS and 1,3-propane disulfonic acid (PDS) in a selectivity enhancement process. The MPS produced, as a dissociated product of SPS, reconverts to SPS with reduction of copper ions (Equation 1).

$$2MPS^- + 2Cu^{2+} \leftrightarrow SPS^{2-} + 2Cu^+ + 2H^+ \quad \text{equation (1)}$$

$$SPS^{2-} + O_2 + H_2O \rightarrow PDS^{2-} + MPS^- + H^+ \quad \text{equation (2)}$$

$$SPS^{2-} + 6H_2O \rightarrow 2PDS^{2-} + 10e^- + 12H^+ \quad \text{equation (3)}$$

While copper is illustrated as the metal used in the series of equations above, block 108 is not limited to copper. The chemical structures of these reactions discussed above, i.e., of SPS to MPS (a reduction) and SPC and MPS to PDS (an oxidation) and MPS to SPS (an oxidation) is illustrated below.

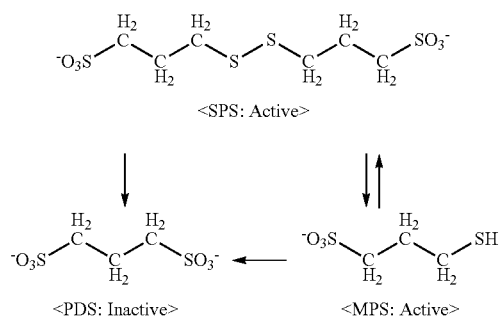

In an embodiment, the selectivity enhancement process includes introducing a suppressor. The suppressor can physically adsorb onto an opening surface(s) to suppress a reaction forming the metal on in the opening. In an embodiment, the suppressor is polyethylene glycol. In an embodiment, the suppressor is polypropylene glycol (PPG). In other embodiments, the suppressor is copolymers of PEG and/or PPG. PEG and PPG polymers are shown below:

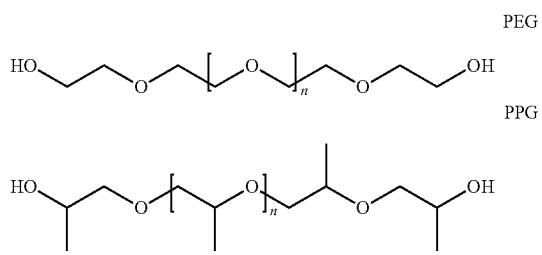

"n" is the degree of polymerization and may be any number greater than 1 including extending into the hundreds or more. Other alkyl-ether polymers are possible as suppressors.

In some implementations, the PPG (or PEG) displaces the accelerator (SPS) discussed above. In some implementations, the suppressor acts to provide a passivating layer on the surface of the opening. The physical adsorption on the surface of the opening (e.g., the catalyst layer), thereby passivating the surface, blocks a reaction of additional metal ions (e.g., Cu) with the surfaces of the opening. In an implementation, the hydrophobic PEG interacts with the metal. Additional atoms may interact with the surface and the PPG/PEG components (e.g., providing bridge molecules between the surface and the suppressor).

The alkyl-ether polymers of the suppressor may be selected based on molecular weight. As the molecular weight increases the suppression properties increase thereby decreasing the growth rate. In an embodiment, the relative molecular weight of the suppressor in comparison with the accelerator provides for the distribution of the accelerator/suppressor within the opening. For example, the molecular weight of the accelerator may be greater than that of the suppressor in order for the accelerator to be provided near a bottom of the trench, while the suppressor is of a higher concentration near a top of the trench.

In an embodiment, the selectivity enhancement process includes introducing a self-assembled monolayer (SAM). The SAM is used to block the surface covered by the SAM from reaction with a precursor of the metal deposition process and thus suppress the metal growth of block 108. Employing a directional plasma removal of portions of the SAM allows for the SAM—and its inhibitor qualities—to be maintained at some regions of the opening, and removed at other regions of the opening. For example, SAM may be maintained on a sidewall portion (e.g., upper portion) of the opening and removed from a bottom portion (e.g., bottom surface, bottom portion of sidewalls). As the SAM in effect deactivates the surface of the opening for metal deposition by replacing the active sites of the surface with the SAM, growth is prohibited on SAM areas. Thus, the SAM may facilitate a bottom-up like gap fill process of block 108.

In an embodiment, the SAM is deposited on the surfaces of the opening. For example, in some implementations, the SAM covers all exposed surfaces of the opening when deposited. For example, the SAM may be deposited along the surface of the catalyst layer. In an embodiment, a directional plasma process is then performed, which serves to remove the SAM from a portion of the surface(s) of the opening. In some implementations, the directional plasma removes the SAM from a bottom surface of the opening. Metal (e.g., a precursor) is then introduced (block 108) providing bottom-up growth due to the inhibiting SAM on the sidewalls and allowing growth at the bottom when the SAM has been removed. The process is then repeated any number of times to control the growth from desired regions of the opening. The SAM may be provided by an atomic layer deposition (ALD) process, chemical vapor deposition (CVD), or other deposition process. The directional plasma may be an Ar, $N_2$, He, $H_2$ or other suitable composition plasma.

In some implementations, SAM is an organic molecule having a reactive end group that facilitates binding to the surface of the opening, an opposing end group that makes the film inert to metal deposition precursor chemistry, and a backbone between ends that allows forming of a densely packed monolayer through van der Waals forces. In an embodiment, the opposing end group is —OH. In an embodiment, the SAM includes a polymer chain with functional group such as dithiothreitol, 3-(trimethoxysilyl) propanethiol, and/or other suitable functional groups.

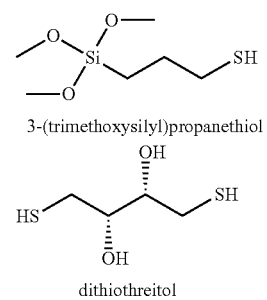

3-(trimethoxysilyl)propanethiol dithiothreitol

The selectivity enhancement processes discussed above—providing and tuning a SAM, introducing an accelerator, introducing a suppressor—may be separately provided in an embodiment of the method 100 or may be provided in combination in an embodiment of the method 100.

Method 100 includes block 108 were metal layer is deposited. The metal layer may be referred to as a metal fill as it "fills" at least a portion of the opening. The metal layer may be deposited by introducing metal atoms or ions to the opening.

The metal may be introduced at the same time as the selectivity enhancement process of block 106. For example, in an embodiment, the selectivity enhancement process of block 106 includes providing an accelerator and/or a suppressor. The accelerator and/or suppressor may be provided concurrently with the metal of block 108.

In an embodiment, the metal may be introduced in cycles alternating with the selectivity enhancement process of block 106. For example, in an embodiment, the selectivity enhancement process of block 106 includes providing a SAM, performing a plasma process to tune the location of the SAM, and introducing the metal. After a first iteration of introducing the metal is completed, the selectivity enhancement process is performed again to deposit the SAM, tune the location of the SAM, after which the metal is introduced again. In other words, there is a cycle of depositing SAM, directional plasma providing exposing a portion of the sidewalls of the opening and/or layer(s) lining the opening (e.g., removing the SAM), and then the metal is again, which repeats any number of times. The subsequent SAM depositions form SAM components on the surfaces of the opening (e.g., catalyst layer) and/or onto the metal deposited in the previous cycle(s).

The metal of block 108 may be deposited by chemical vapor deposition (CVD), atomic layer deposition (ALD), or other suitable method. The metal of block 108 may be a pure metal or a metal alloy. Example metals include W, Mo, Pt, Pd, Co, Ru, Rh, Ag, Au, Cu, Ni, Fe, and/or other metals or alloy such as NiB, NiP, CoNiP, CoNiB, CoMnP, CoNiMnP, CoWP, CoWB, CoNiReP, CoB, CoP, CoFeB, CoNiFeB, FeP, and/or other suitable metal alloys. In some implementations, a plurality of metal layers is formed in the opening.

Thus, the method 100 forms a metallization feature in an opening. The metallization feature includes the catalyst layer and the overlying metal layer(s). In an embodiment, the catalyst layer of block 104 is Pd. In a further embodiment, the metal layer of block 108 is cobalt (Co) or nickel (Ni). In an embodiment, the catalyst layer of block 104 is Ru. In a further embodiment, the metal layer of block 108 is cobalt (Co) or copper (Cu). In some implementations, by-products from various reactions between elements, including the catalyst material, the materials of the selectivity enhancement process (e.g., suppressor, accelerator, SAM), and the metal deposition process may be included in the metallization feature. Exemplary impurities such as B, P, W, Sn, Mn and/or other impurities found as a by-product, including from reducing agents like HCHO, $N_2H_4$, DMAB, $H_2PO_2^-$, $BH_4^-$ solution used in forming the metal layer(s), could be found in the formed metal. Exemplary impurities such as by-products of accelerator/suppressor components such as C, S, O, N or Si residues (e.g., SPS, MPS, PEG, PPG) may be found between catalyst layer and metal. Impurities are discussed in further reference below with reference to FIG. 7C.

The selectivity enhancement of block 106 and the metal deposition of block 108 together provide for super-conformal growth of metallization in the opening provided in block 102 to form the metallization feature. Super-conformal growth provides a higher growth rate at one portion of an opening (or trench) such as at the bottom of the opening compared to its sidewall. In some implementations of the method 100, the rate of metal deposition increased farther down the opening can yield defect-free, seam-free, void-free filling of the metallization. The defect-free, void-free, and/or seam-free metallization feature has a benefit of lower resistance. The defect-free, void-free, and/or seam-free metallization feature has a benefit of uniformity for subsequent processing (e.g., etching back). In contrast, in other deposition methods, seams may be formed in the metallization. For example, a seam can be formed at an approximate middle of an opening when filled with metallization as the metallization growth from two adjacent surfaces (e.g., sidewalls) interface; the seam can create a void or a weak point in the metal.

Figure 2:
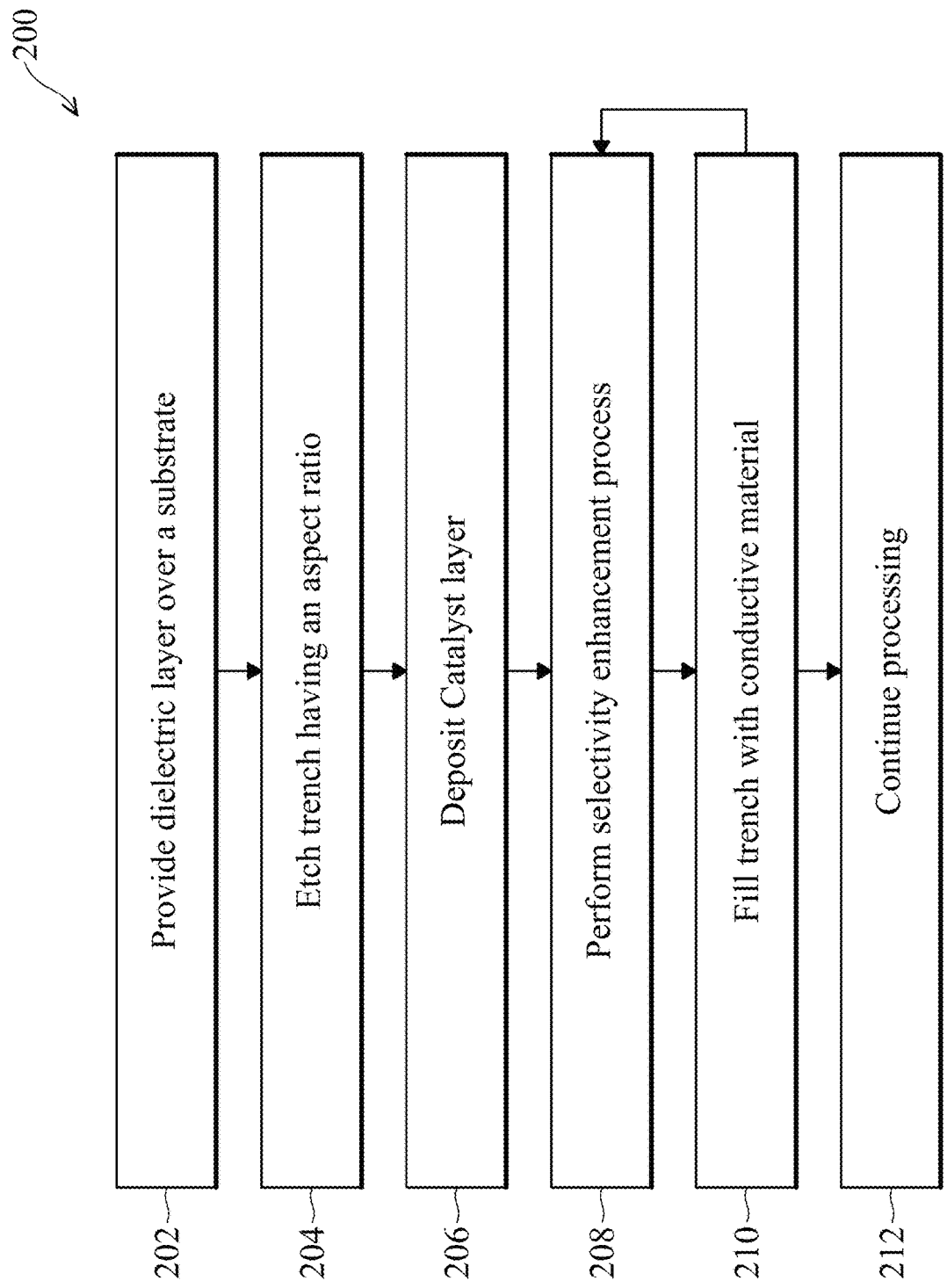
FIG. 2 illustrates a flow chart of an embodiment of a method of a semiconductor device including forming a metal component in a trench, according to one or more aspects of the present disclosure.

One exemplary embodiment implementing aspects of the method 100 is described with reference to the method 200 of FIG. 2. The method 200 is described below in conjunction with FIGS. 3, 4A, 4B, 5A, 5B, 6A, 6B, 7A, 7B, and 7C, which are fragmentary cross-sectional views of a device 300 at different stages of fabrication according to embodiments of the method 200. Method 200 is merely an example and is not intended to limit the present disclosure to what is explicitly illustrated therein. Additional steps may be provided before, during and after the method 200, and some steps described can be replaced, eliminated, or moved around for additional embodiments of the method. Not all steps are described herein in detail for reasons of simplicity. Throughout the present disclosure, like reference numerals denote like features unless otherwise excepted.

The method 200 includes block 202 where a dielectric layer is provided over a substrate. As illustrated in exemplary FIG. 3, a device 300 includes a substrate 302. In an embodiment, the substrate 302 is a silicon substrate (e.g., including bulk single-crystalline silicon). The substrate 302 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 302 may be a semiconductor-on-insulator substrate, such as a silicon-on-insulator (SOI) substrate, a silicon germanium-on-insulator substrate, or a germanium-on-insulator substrate. The substrate 302 may include n-type doped region(s) and p-type doped region(s).

Figure 3:
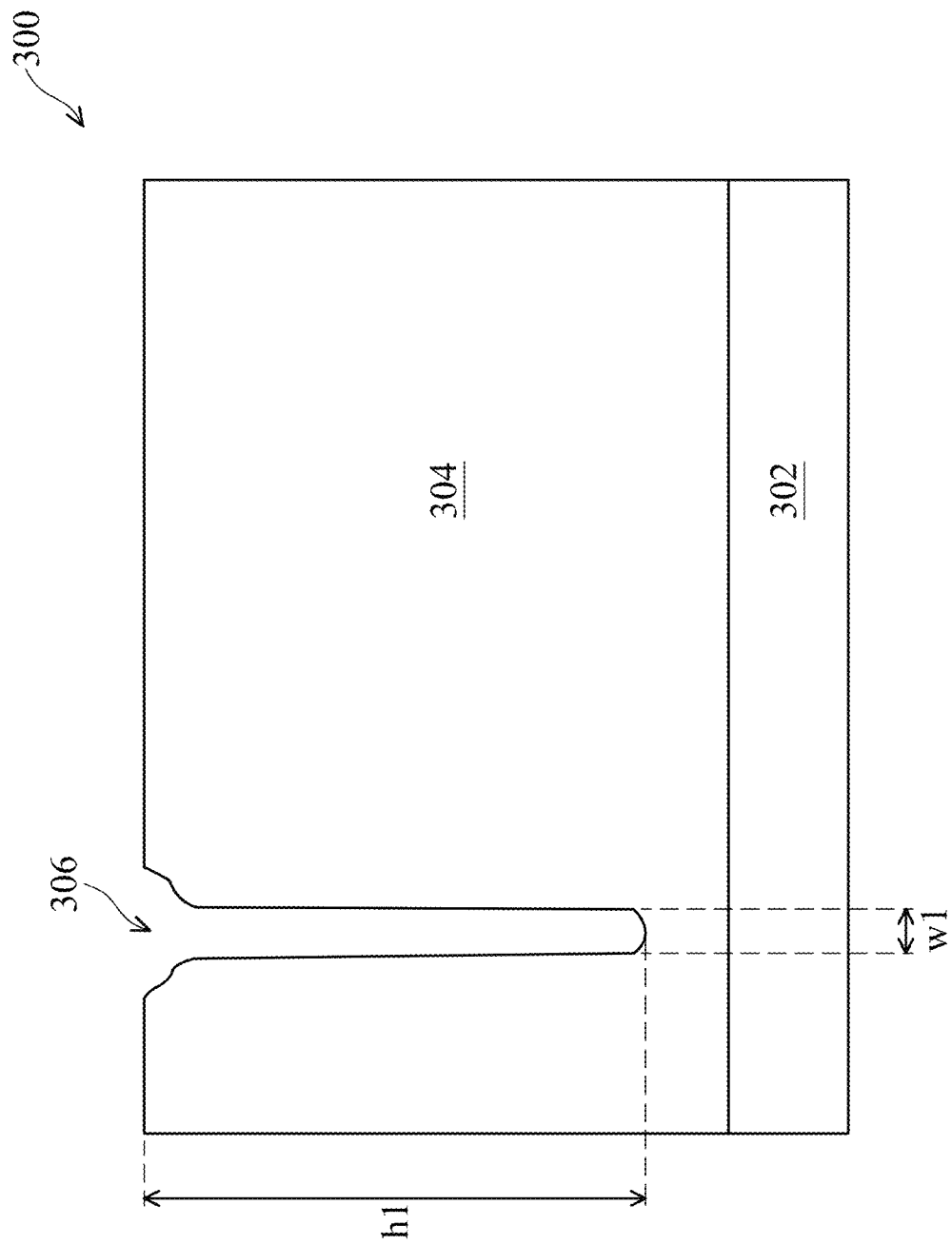

Continuing to refer to the example of FIG. 3, a dielectric layer 304 is formed over the substrate 302. Exemplary compositions of the dielectric layer 304 include SiN, $SiO_2$, TiN, TiAlC, $HfO_2$, $TiO_2$, SiCN, SiCO, SiCON, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), titanium nitride (TiN), other low-k dielectrics, and/or other suitable dielectrics.

The method 200 includes block 204 where a trench is etched in the dielectric layer. Referring still to the example of FIG. 3, a trench (or opening) 306 is formed in the dielectric layer 304. The trench 306 may have surfaces of dielectric layer 304. In an embodiment, such as illustrated in FIG. 3, the trench 306 has a bottom surface of dielectric layer 304. However, in other embodiments, the trench 306 bottom surface may be of a different material such as a conductive material of a metallization line or via, a gate material of gate electrode, a semiconductor material of a source/drain feature, and/or other semiconductor features.

The trench 306 may be provided in the dielectric layer 304 by patterning a masking element such as photoresist disposed over the dielectric layer and etching the dielectric layer through an opening in the masking element. In an embodiment, the width w1 of the trench 306 of between approximately 5 nanometers (nm) and approximately 20 nm. The aspect ratio of the trench 306 may be greater than 1. In an embodiment, the aspect ratio is between approximately 5 and approximately 20. The aspect ratio may be determined by the height (h1)/width (w1).

The trench 306 is patterned to define an opening that is to be filled with conductive material (see block 210) to form a conductive feature. The conductive feature formed may be a metal gate structure, a contact element, a multilayer interconnect feature, and/or other suitable features of semiconductor devices. In an embodiment, the metal gate structure may be a metal gate of a planar transistor, a fin-type field effect transistor (FinFET), or other transistor types including GAA or CFET devices such as discussed below. In an embodiment, the contact element is a contact structure extending to physically and electrically contact a semiconductor device feature such as a source feature, a drain feature, a gate feature, and/or other connections provided in semiconductor devices. In an embodiment, the multilayer interconnect feature is a metal line or via of a device such as a back-end-of-the-line (BEOL) metal line or via or a VLI interconnect.

The method 200 also includes block 206 where a catalyst layer is formed on the surfaces of the opening/trench. The catalyst layer may be substantially similar to the catalyst layer formed in block 104 of the method 100, described with reference to FIG. 1. Referring to the example of FIG. 4A, a catalyst layer 308A is formed on the surfaces of the trench 306. In the exemplary embodiment of FIG. 4A, the catalyst layer 308A is a conformal layer having a thickness t1. In an embodiment, the catalyst layer 308A may be formed by ALD or CVD. In an embodiment, the catalyst layer 308A is selected from columns 8 to 12 of the periodic table, such as Pt, Pd, Co, Ru, Rh, Ag, Au, Cu, Ni, and/or combinations thereof.

Figure 4B:
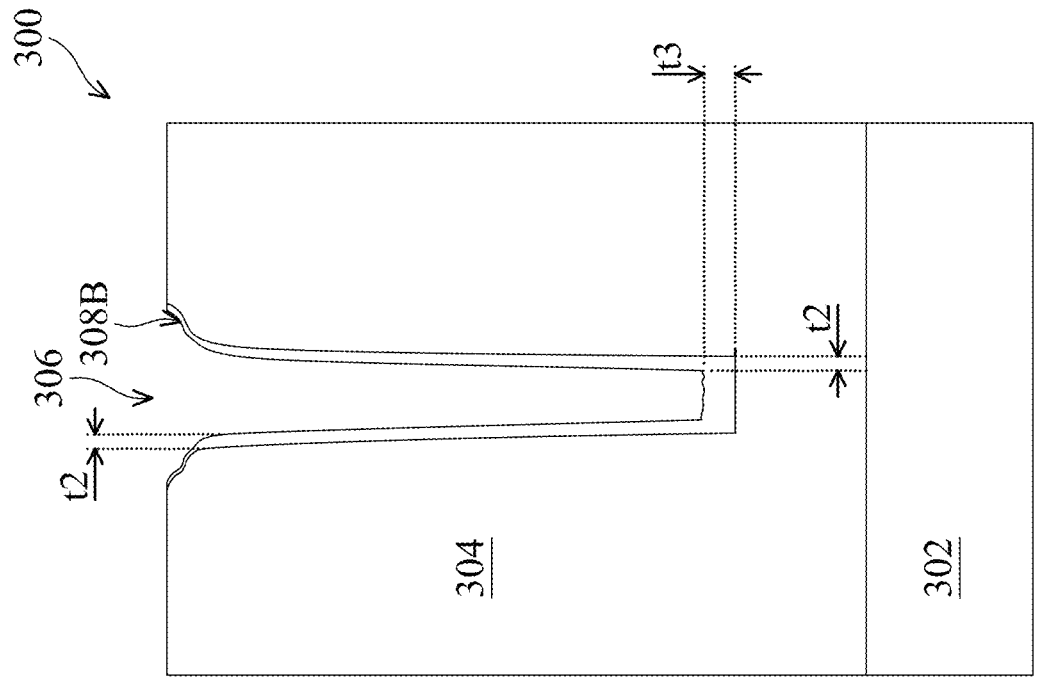
Figure 4A:
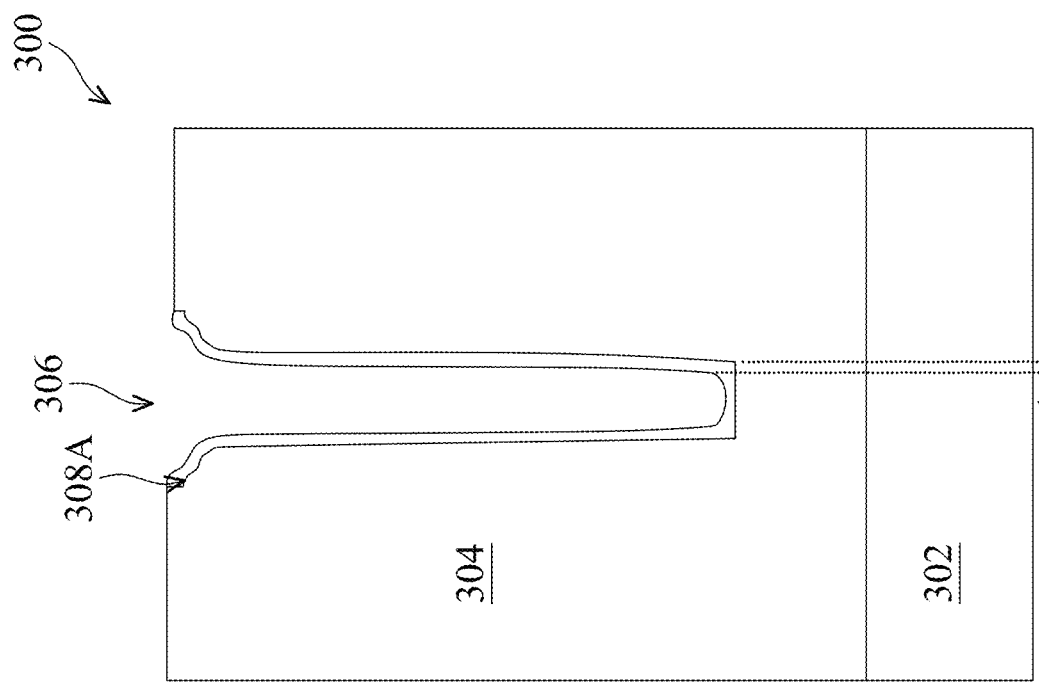

Referring to the example of FIG. 4B, an alternative embodiment of a device 300' is illustrated. The device 300' is substantially similar to the device 300, but has a catalyst layer 308B formed on the surfaces of the trench 306. In the example of FIG. 4B, the catalyst layer 308B is a non-conformal layer having a thickness t2 on sidewall surfaces of the trench 306 and a thickness t3 on a bottom surface of the trench 306. The thickness t3 is greater than the thickness t2. In an embodiment, the catalyst layer 308B may be formed by PVD, ion implantation, and/or other suitable processes. In an embodiment, the catalyst layer 308B selected from columns 8 to 12 of the periodic table, such as Pt, Pd, Co, Ru, Rh, Ag, Au, Cu, Ni, and/or combinations thereof.

The method 200 includes block 208 where a selectivity enhancement process is performed. The selectivity enhancement process may be substantially similar to the selectivity enhancement process of block 106 of the method 100, described above with reference to FIG. 1. The method 200 also includes block 210 where the trench is filled with conductive material, which is described along with the block 208 for ease of understanding. The metal deposition process of block 210 may be substantially similar to block 108 of the method 100, described above with reference to FIG. 1.

Figure 5A:
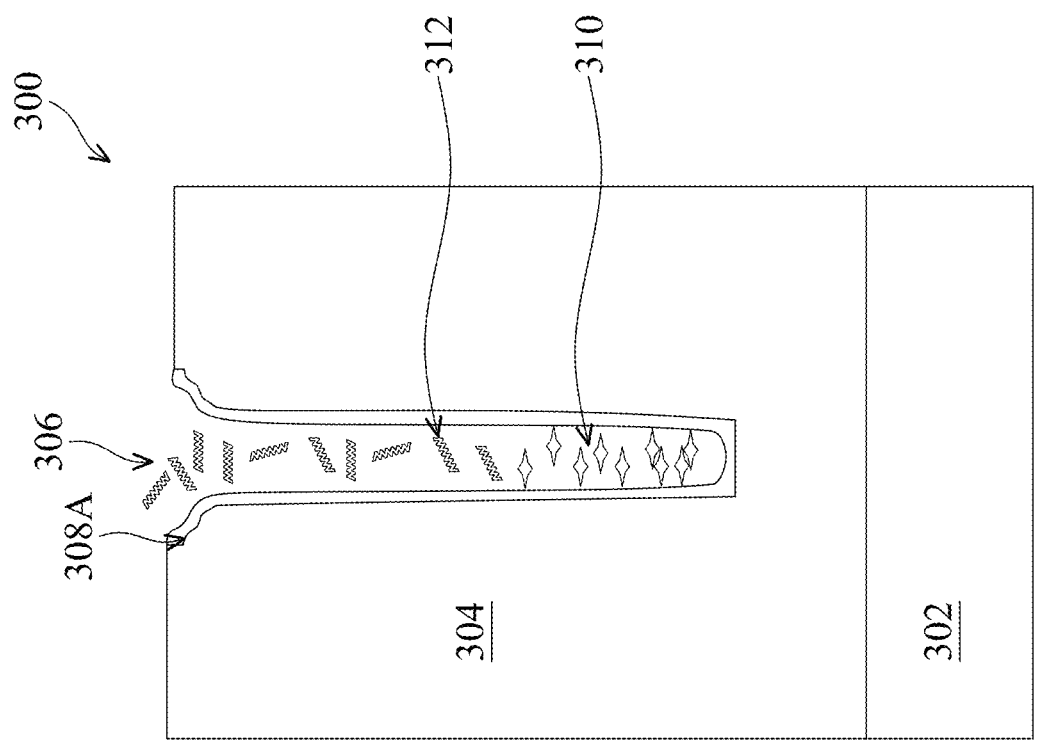

As discussed above with reference to the method 100, in an embodiment, the selectivity enhancement process includes introduction of accelerator and/or suppressor components. FIG. 5A illustrates accelerator 310 and suppressor 312 are provided to the device 300. In an embodiment, the accelerator 310 is SPS and/or MPS as discussed above. In an embodiment, the suppressor is PEG, PPG, and/or a combination thereof as discussed above. The molecular weight of the accelerator 310 and/or the suppressor 312 may determine its relative position when introduced to the device 300 as discussed above. It is noted that for exemplary purposes the embodiment of the device 300 having the catalyst layer 308A is used for FIGS. 5A-7C, however, the teachings apply equally to an embodiment having the catalyst layer 308B.

Figure 6A:
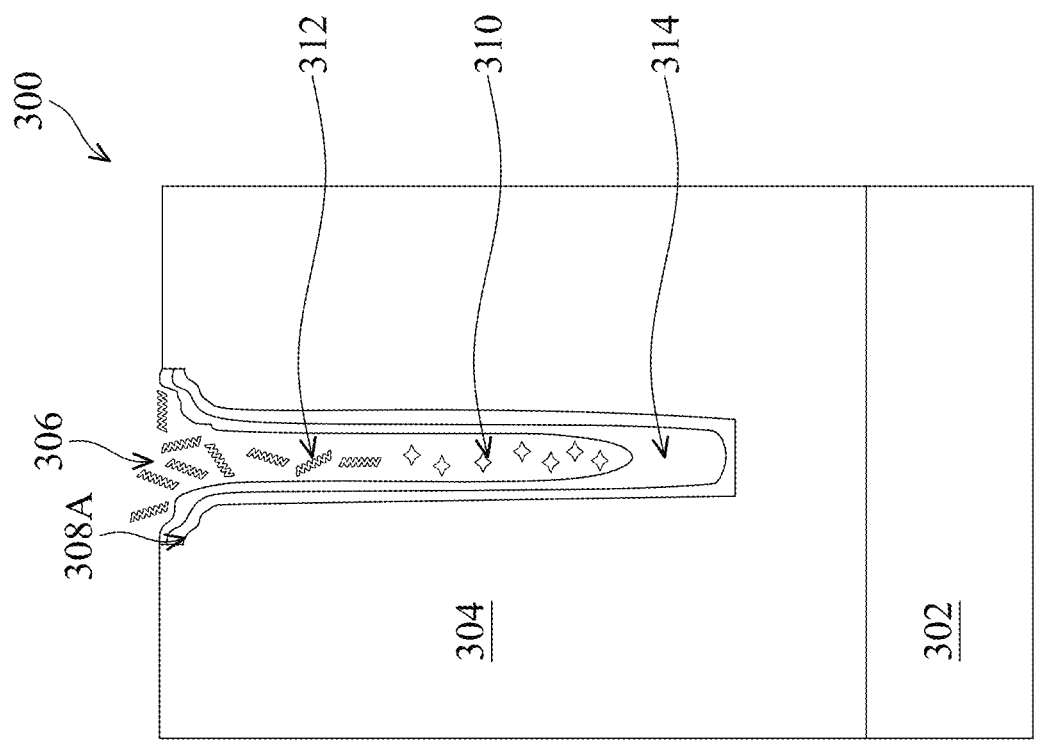

In an embodiment, blocks 208 and 210 are performed concurrently. For example, the accelerator/suppressor components are provided during the metal deposition process (e.g., during ALD, CVD, PVD), for example, concurrent with the precursors for depositing the metal. In an embodiment, the accelerator/suppressor components provide for bottom-up growth of the metal layer of block 210. FIG. 6A illustrates the device 300 after partial deposition of the metal layer has occurred providing a portion of a metal layer 314 extending from a bottom of the trench 306. FIG. 6A is illustrative of bottom-up growth as the metal layer 314 at the bottom surface of the trench 306 is thicker than that at the sidewall surfaces of trench 306. This bottom up growth is provided by the accelerator/suppressor components as discussed above with reference to the method 100 of the FIG. 1.

Figure 7A:
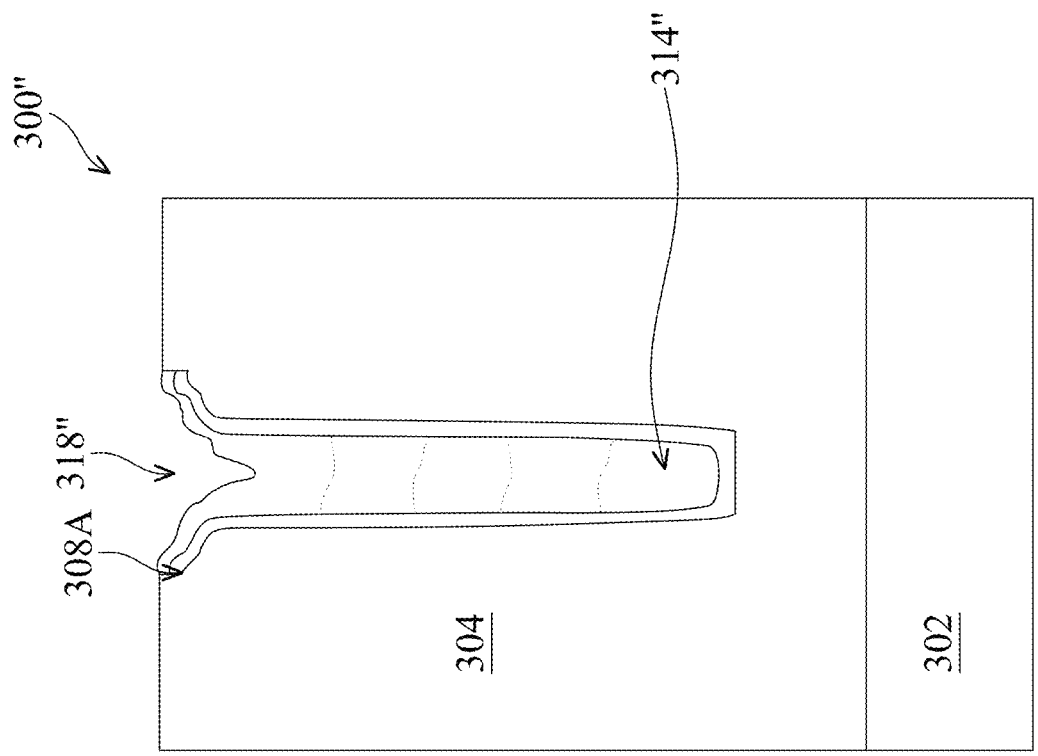

FIG. 7A illustrates the device 300 continuing the deposition process of block 210 from the partial deposition of FIG. 6A to provide a device with the metal layer or metal fill 314 substantially filling the trench 306 to form a metal feature 318. The metal feature 318 is without forming a seam or void. The metal layer 314 of the metal feature 318 is illustrated as having a substantially uniform grain structure. The metal layer 314 is made up of individual crystalline areas known as "grains." The structure, size and orientation of these grains result from the material composition and the manner of depositing the material. The method 200 in an embodiment provides for substantially uniform grain size and dispersion. In some implementations, the degree of bottom-up growth of the metal layer 314 affects the uniformity of the grain size, location of the grain boundaries and of the grains where the bottom up growth provides for more uniformity.

The metal feature 318 includes the catalyst layer 308A and metal layer 314. In an embodiment, the catalyst layer 308A is Pd. In a further embodiment, the metal layer 314 is Co or Ni. In an embodiment, the catalyst layer 308A is Ru. In a further embodiment, the metal layer 314 is Co or Cu. Again, the metal feature 318 may also include the catalyst layer 308B and the metal layer 314 in some embodiments.

Figure 5B:
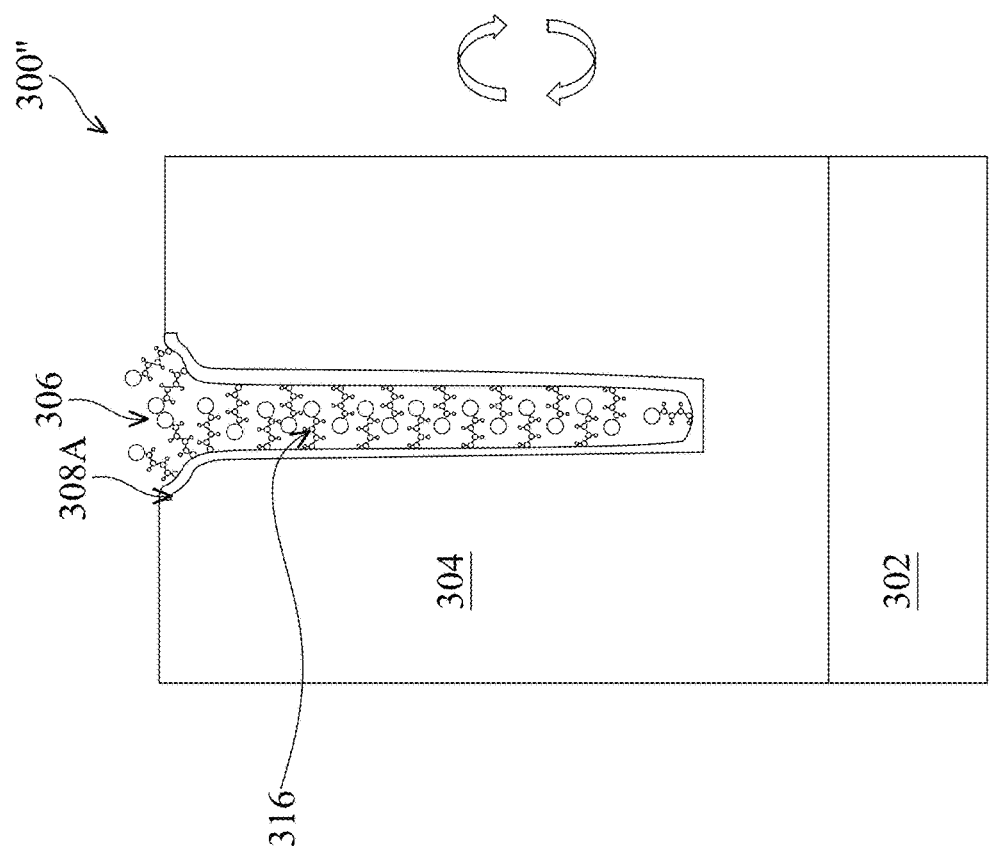

In an embodiment, as discussed above with reference to the method 100, the selectivity enhancement process of block 208 may include an introduction of a SAM to the opening. FIG. 5B illustrates SAM 316 deposited on the device 300". The SAM 316 may be substantially similar to as discussed above with reference to block 106 of the method 100.

Figure 6B:
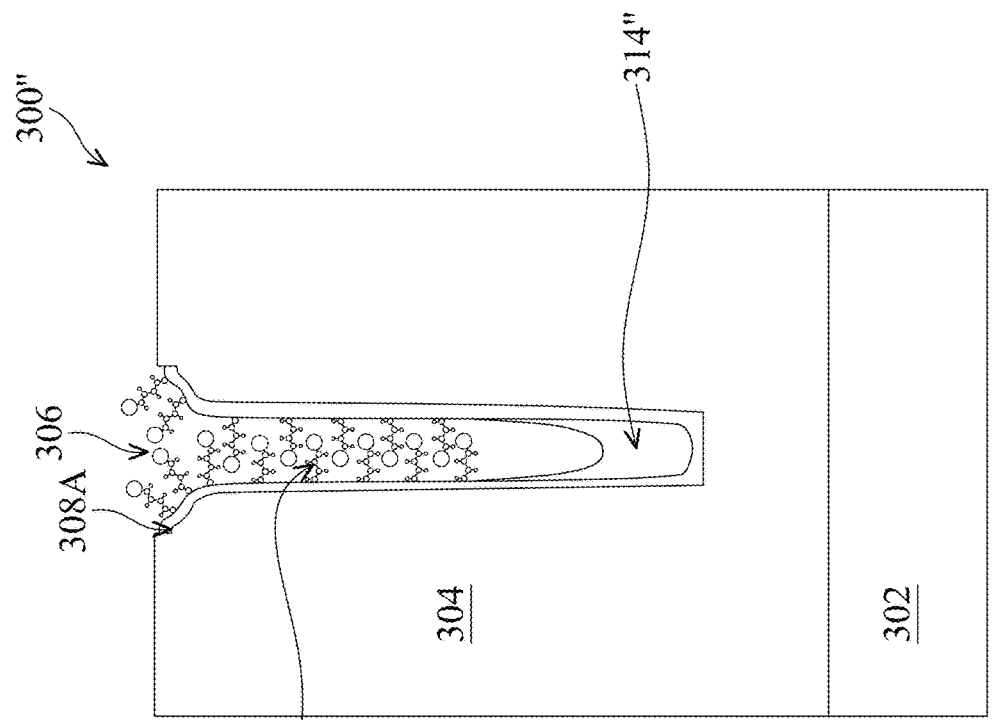

In an embodiment, block 208 and block 210 are performed iteratively. For example, the SAM is deposited, and then the metal deposition process (e.g., during ALD, CVD, PVD) is performed. As discussed above, after deposition of SAM and before deposition of the metal, a directional process (e.g., plasma) may be performed to tune the location of the SAM. The process is then iteratively repeated until the deposited metal fills the trench. In an embodiment, the SAM provides for bottom-up growth by inhibiting the metallization from being formed at upper regions of the sidewall surfaces of the trench 306 during the initial growth. FIG. 6B illustrates the device 300″ after some of the metal deposition has occurred providing a portion of a metal layer 314″ extending from a bottom of the trench 306. The SAM 316 is formed on upper portions of the trench sidewall surfaces 306 to inhibit (or substantially prevent) deposition of the metal layer 314″ on the sidewalls. As such, FIG. 6B is illustrative of bottom-up growth as the metal layer 314″ at the bottom surface of the trench 306 is thicker than that at the sidewalls of trench 306, which may be substantially zero during the initial growth. This bottom-up growth is provided by the SAM may be substantially similar to as discussed above with reference to the method 100 of the FIG. 1.

Figure 7B:
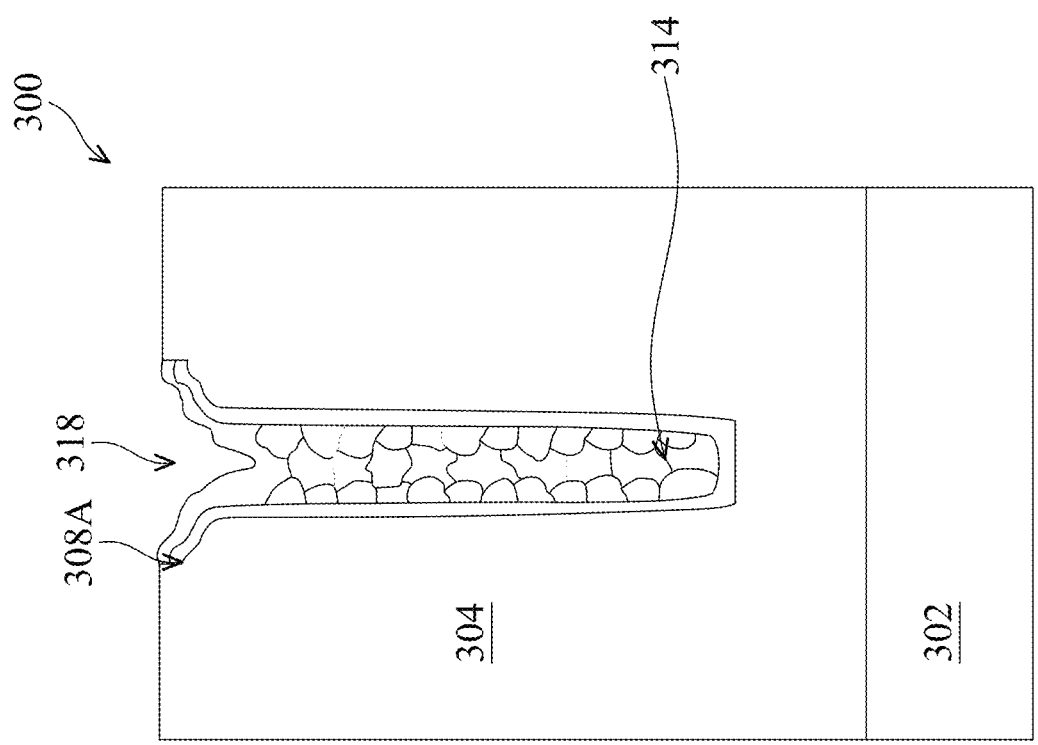

FIG. 7B illustrates the device 300″ continuing the deposition process to form the metal layer 314″ substantially filling the trench 306 resulting in the metal feature 318″. The metal feature 318″ is formed without a seam or void within the trench 306. The method 200 in an embodiment provides for substantially uniform grain size and dispersion; the metal layer 314″ being illustrated as having a substantially uniform grain structure. In some implementations, the degree of bottom-up growth of the metal layer 314″ affects the uniformity of the grain size and orientation the bottom up growth providing for more uniformity. For example, in an embodiment, the grain boundaries extend substantially horizontally across the trench 306 as shown in FIG. 7B as each cycle of the method 200 (e.g., SAM deposition, tuning, metal deposition) may define one horizontal grain boundary. For example, FIG. 7B illustrates 5 iterations of SAM deposition, tuning, and metal deposition processes.

The metal feature 318″ includes the catalyst layer 308A and metal layer 314″. Exemplary metal layer 314″ compositions include W, Mo, Pt, Pd, Co, Ru, Rh, Ag, Au, Cu, Ni, Fe or alloys like NiB, NiP, CoNiP, CoNiB, CoMnP, CoNiMnP, CoWP, CoWB, CoNiReP, CoB, CoP, CoFeB, CoNiFeB, FeP, and/or combinations thereof. In an embodiment, the catalyst layer 308A is Pd. In a further embodiment, the metal layer 314″ is Co or Ni. In an embodiment, the catalyst layer 308A is Ru. In a further embodiment, the metal layer 314″ is Co or Cu. Again, the metal feature 318″ may also include the catalyst layer 308B and the metal layer 314″ in some embodiments.

FIG. 7C is an embodiment of the device 300 of FIG. 7A labeled as device 300‴. The device 300‴ provides a metal feature substantially similar to as discussed above with reference to device 300, but pictorially illustrating residue that may be found in the metal feature 318‴. A first residue 702 may be found in the metal fill 314. The first residue 702 may be B, P, W, Sn, Mo, and/or other residue by-product. The first residue 702 may originate from the reducing agent such as HCHO, $N_2H_4$, DMAB, $H_2PO_2^-$, $BH_4^-$ solution found in deposition of the metal layer 314. Similar residues may be found in an embodiment of the device 300″.

A second residue 704 may be found between the catalyst layer 308A and the metal layer 314. The second residue may be C, S, O, N, Si, and/or other components. The second residue 704 may originate from the accelerator and/or suppressor materials such as residues from SPS, MPS, PEG, PPG, and/or accelerator/suppressors as discussed above. Similar residues may be found in an embodiment of the device 300″.

The method 200 includes block 212 where additional processing steps are performed. The method 200 may include additional steps such like chemical mechanical polish (CMP), for example, providing a planar top surface of the metal feature 318 (or metal feature 318″, 318‴). Additional features may be formed interconnecting with the metal feature 318 including metal lines, vias, gate structures, source/drain features, capacitors, memory devices, input/output interconnects, and/or various other semiconductor features.

Figure 8:
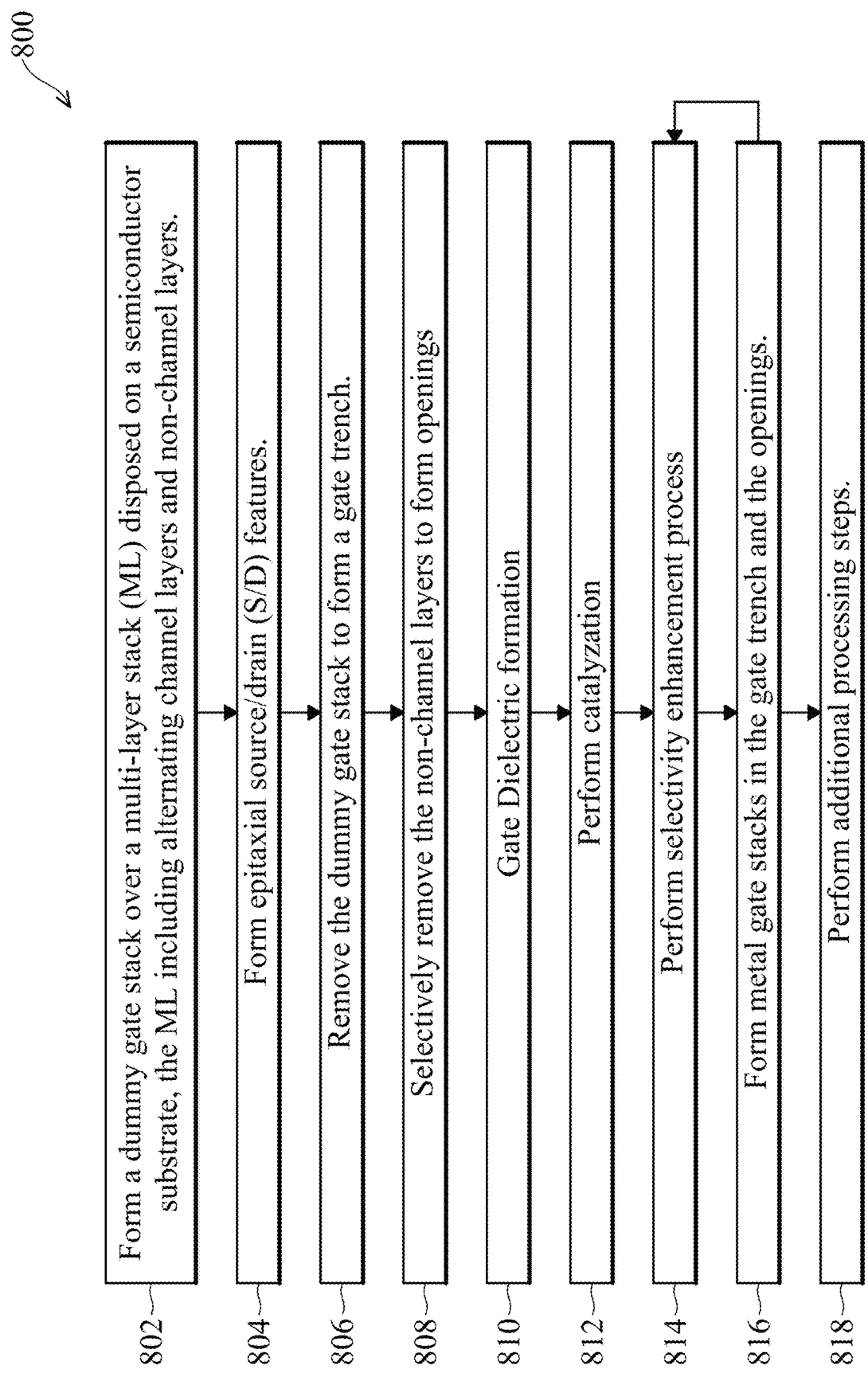
FIG. 8 illustrates a flow chart of an embodiment of a method of a semiconductor device including forming a metal component (e.g., a metal gate) of a gate-all-around (GAA) transistor, according to one or more aspects of the present disclosure.

Turning now to FIG. 8, another exemplary embodiment implementing aspects of the method 100 is described with reference to the method 800. Aspects of the method 200 of FIG. 2 also apply to the method 800, which also includes forming a metal feature in a trench or opening. In particular, embodiments of the method 800 form a gate-all-around (GAA) device having a metal gate structure. The method 800 is described below in conjunction with FIGS. 9A, 9B, which are a fragmentary perspective view and top view respectively of a device 900, and FIGS. 10, 11, 12, 13, 14, 15, 16, and 17, which are fragmentary cross-sectional views each of the device 900 at different stages of fabrication according to embodiments of method 800. Method 800 is merely an example and are not intended to limit the present disclosure to what is explicitly illustrated therein. Additional steps may be provided before, during and after the method 800, and some steps described can be replaced, eliminated, or moved around for additional embodiments of the method. Not all steps are described herein in detail for reasons of simplicity. Throughout the present disclosure, like reference numerals denote like features unless otherwise excepted.

Figure 9:
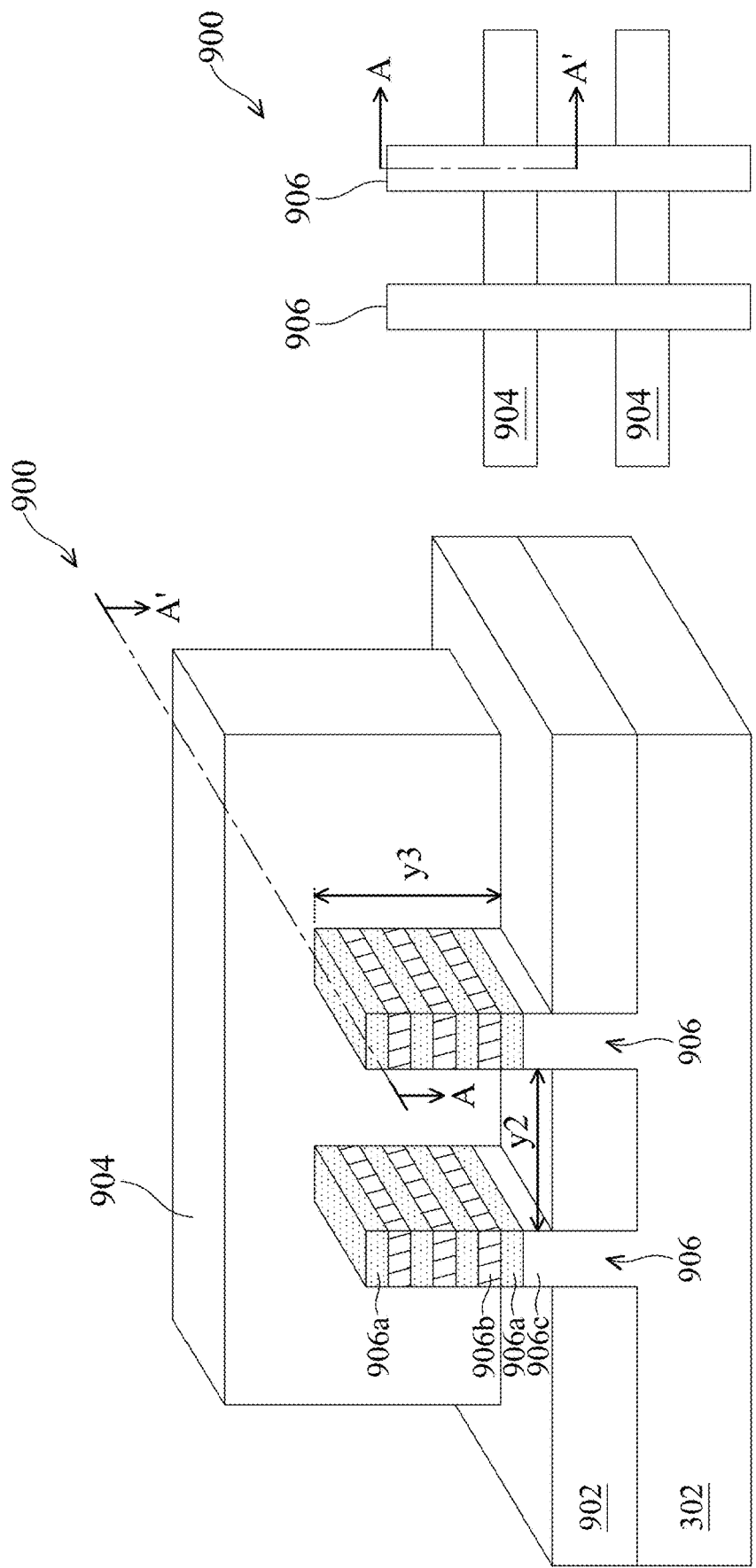
FIG. 9A illustrates a perspective view of an embodiment of a semiconductor device according to one or more fabrication stages in the method of FIG. 8, according to one or more aspects of the present disclosure.
FIG. 9B illustrates a corresponding top view of an embodiment of the semiconductor device of FIG. 9A.
Figure 10:
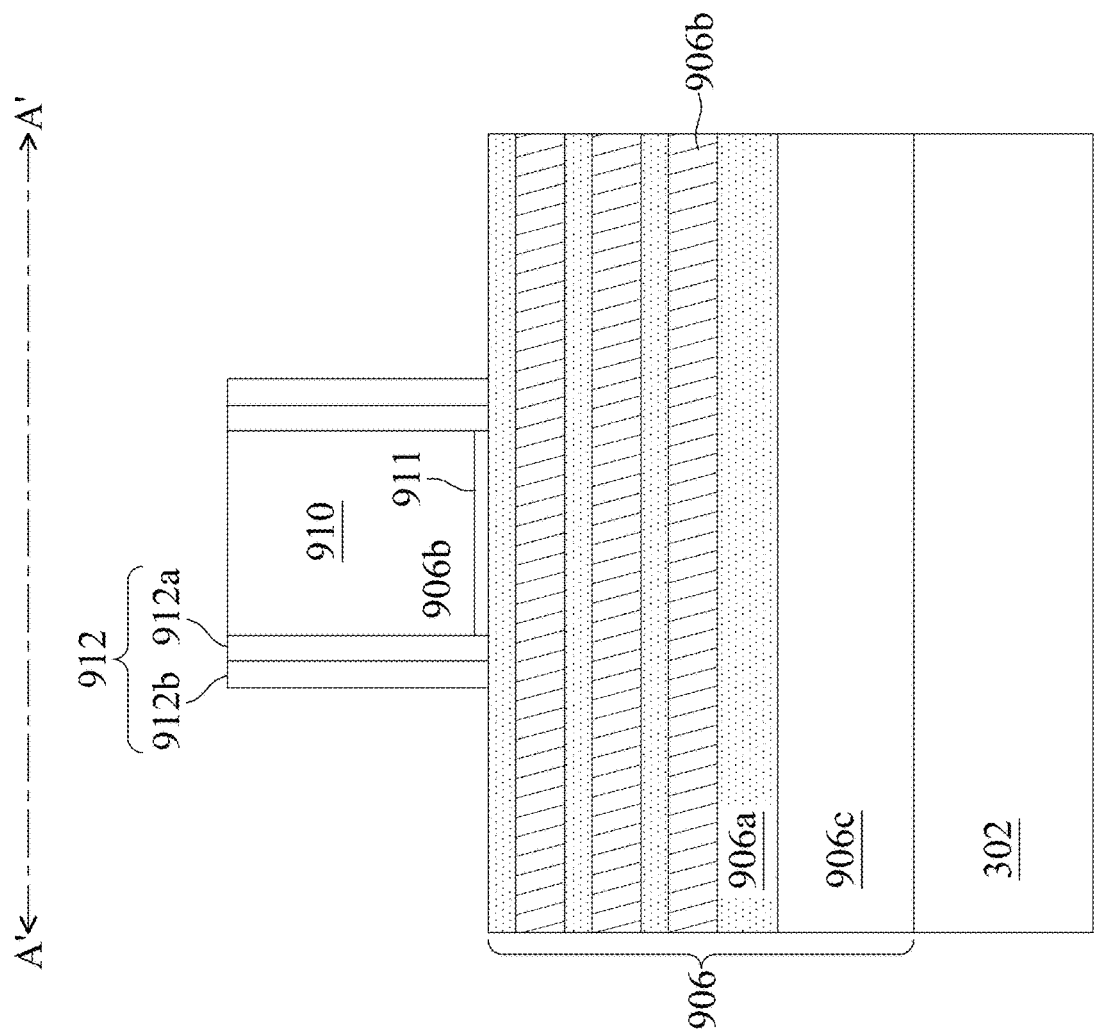
FIGS. 10, 11, 12, 13, 14, 15 and 16 illustrate fragmentary cross-sectional views of a structure during various fabrication stages in the method of FIG. 8 taken along line A-A' as shown in FIGS. 9A and 9B, according to one or more aspects of the present disclosure.

As illustrated in FIGS. 9A and 10, the device 900 includes a substrate 302. The substrate 302 may be substantially similar to as discussed above. The device 900 includes a number of fin-shaped active regions 906 disposed over the substrate 302. The number of fin-shaped active regions 906 shown in FIGS. 9A and 9B are for illustration purpose only and should not be construed as limiting the scope of the present disclosure. The fin-shaped active region 906 is formed from a top portion 906c of the substrate 302 and a vertical stack of alternating semiconductor layers 906a and 906b. The fin-shaped active region 906 may be formed by epitaxially growing a plurality of layers over the substrate 302 and patterning the layers by lithography processes. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the fin-shaped active regions 906 may be performed using double-patterning or multi-patterning processes to create patterns having pitches smaller than what is otherwise obtainable using a single, direct photolithography process. The etching process can include dry etching, wet etching, and/or other suitable processes. In the depicted embodiment, the vertical stack of alternating semiconductor layers 906a and 906b may include a number of channel layers 906a interleaved by a number of sacrificial layers 906b forming multi-layer (ML). Each of the channel layers 906a may be formed of silicon (Si) and each of the sacrificial layers 906b may be formed of another material such as silicon germanium (SiGe). In an embodiment, the sacrificial layers 906b have a thickness of between approximately 5 nanometers (nm) and 15 nm. The channel layers 906a and the sacrificial layers 906b may be epitaxially deposited on the substrate 302 using molecular beam epitaxy (MBE), vapor-phase epitaxy (VPE), ultra-high vacuum CVD (UHV-CVD), and/or other suitable epitaxial growth processes. In an embodiment, a distance y2 between fin-shaped active regions 906 is between approximately 10 nanometers (nm) and 25 nm. In an embodiment, the fin-shaped active region 906 has a height y3 above an isolation feature 902. The height y3 may be between approximately 80 nm and 200 nm. Any number of channel layers 906a may be provided in the fin-shaped active region 906, for example, 1 to 4 channel layers 906a is typical.

The device 900 also includes an isolation feature 902 (shown in FIG. 9A) formed around each fin-shaped active region 906 to isolate the fin-shaped active region 906 from an adjacent fin-shaped active region 906. The isolation feature 902 may also be referred to as a shallow trench isolation (STI) feature and may include silicon oxide, silicon oxynitride, fluorine-doped silicate glass (FSG), a low-k dielectric, combinations thereof, and/or other suitable materials. The isolation feature 902 may be a multi-layer feature.

The device 900 includes dummy gate stacks 904 disposed over the fin-shaped active region 906 (shown in FIGS. 9A, 9B, 10). The dummy gate stacks 904 are formed over a channel region of the fin-shaped active region 906 and define source/drain regions of the fin-shaped active region 906 that are not vertically overlapped by the dummy gate stacks 904. In some implementations, a gate replacement process (or gate-last process) is adopted where the dummy gate stacks 904 serve as placeholders for functional gate structures (e.g., metal gate structures 1600 shown in FIG. 16). In an embodiment, the dummy gate stack 904 includes a dummy dielectric layer 911 and a dummy gate electrode layer 910 over the dummy dielectric layer 911. In some embodiments, a gate-top hard mask layer is disposed over the dummy gate electrode layer 910. The dummy dielectric layer 911 may include silicon oxide. In an embodiment, the dummy gate electrode layer 910 is polysilicon. The gate-top hard mask layer may include silicon oxide layer, silicon nitride, and/or other suitable materials. Suitable deposition process, photolithography and etching process may be employed to form the dummy gate stack 904.

Spacer elements 912 (shown in FIG. 10) are formed on sidewalls of the dummy gate stack 904. The spacer elements 912 may include a multiple layer structure including a first layer 912a and a second layer 912b. The spacer elements 912 may be formed by a dielectric material such as silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stack 904 and subsequently etched (e.g., anisotropically etched) to form spacer elements 912.

Figure 11:
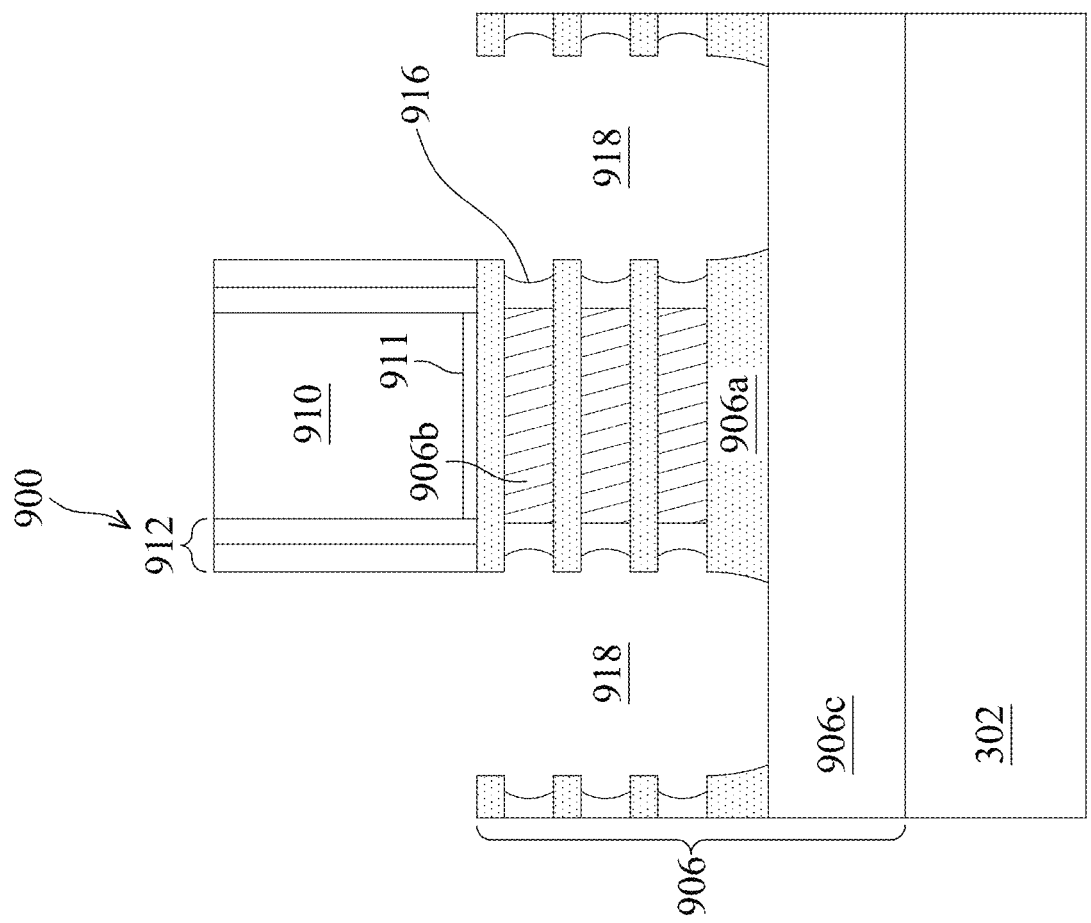
Figure 12:
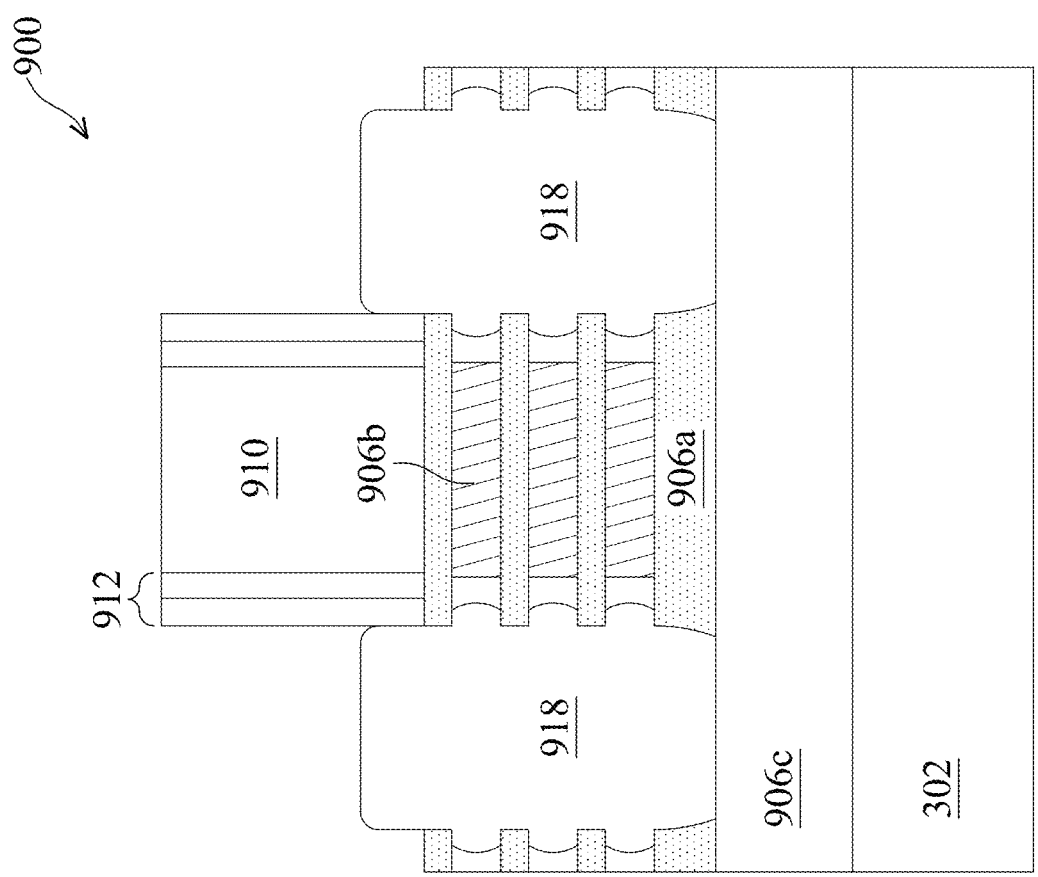

The method 800 includes a block 804 where source/drain features are formed. The fin-shaped active regions 906 are recessed to form source/drain openings 914 (shown in FIG. 11). In some embodiments, the source/drain regions are anisotropically etched by a plasma etch with a suitable etchant, such as fluorine-containing etchant, oxygen-containing etchant, hydrogen-containing etchant, a fluorine-containing etchant (e.g., $CF_4$, $SF_6$, $CH_2F_2$, $CHF_3$, and/or $C_2F_6$), a chlorine-containing etchant (e.g., $Cl_2$, $CHCl_3$, $CCl_4$, and/or $BCl_3$), a bromine-containing etchant (e.g., HBr and/or $CHBr_3$), an iodine-containing etchant, other suitable etchants, and/or combinations thereof. In embodiments such as illustrated in FIG. 11, the source/drain openings 914 extend through the vertical stack of ML and extend to and/or into the top portion 906c of the substrate 302 in the fin-shaped active region 906. As illustrated in FIG. 11, sidewalls of the channel layers 906a and the sacrificial layers 906b are exposed in the source/drain openings 914. In some implementations, sacrificial layers 906b are recessed and inner spacers 916 are formed between the source/drain region and the channel region. In other implementations, oxidation of sacrificial layers 906b forms the inner spacers 916.

Block 804 continues to form source/drain features 918 (FIG. 12) in the source/drain openings 914 (FIG. 11). Source/drain feature(s) may refer to a source feature or a drain feature, individually or collectively dependent upon the context. Depending on the conductivity type of the to-be-formed transistor, the source/drain features 918 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. Although not separately labeled, the source/drain features 918 may include multiple epitaxial semiconductor layers having different dopant concentrations.

In some implementations, a contact etch stop layer (CESL) and an interlayer dielectric (ILD) layer are deposited over the substrate 302 and over the source/drain features 918. In an embodiment, the CESL is silicon nitride or other suitable dielectric materials. In an embodiment, the ILD layer tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The method 800 includes block 806 where the dummy gate stack is removed to form a gate trench. Referring to the example of FIG. 13, the dummy gate stacks 904 are removed to form an opening 920. The removal of the dummy gate stacks 904 may include performing one or more etching process selective to the materials in the dummy gate stacks 904 to form the opening (or gate trenches) 920. For example, the removal of the dummy gate stacks 904 may be performed using a selective wet etch, a selective dry etch, or a combination thereof.

Figure 14:
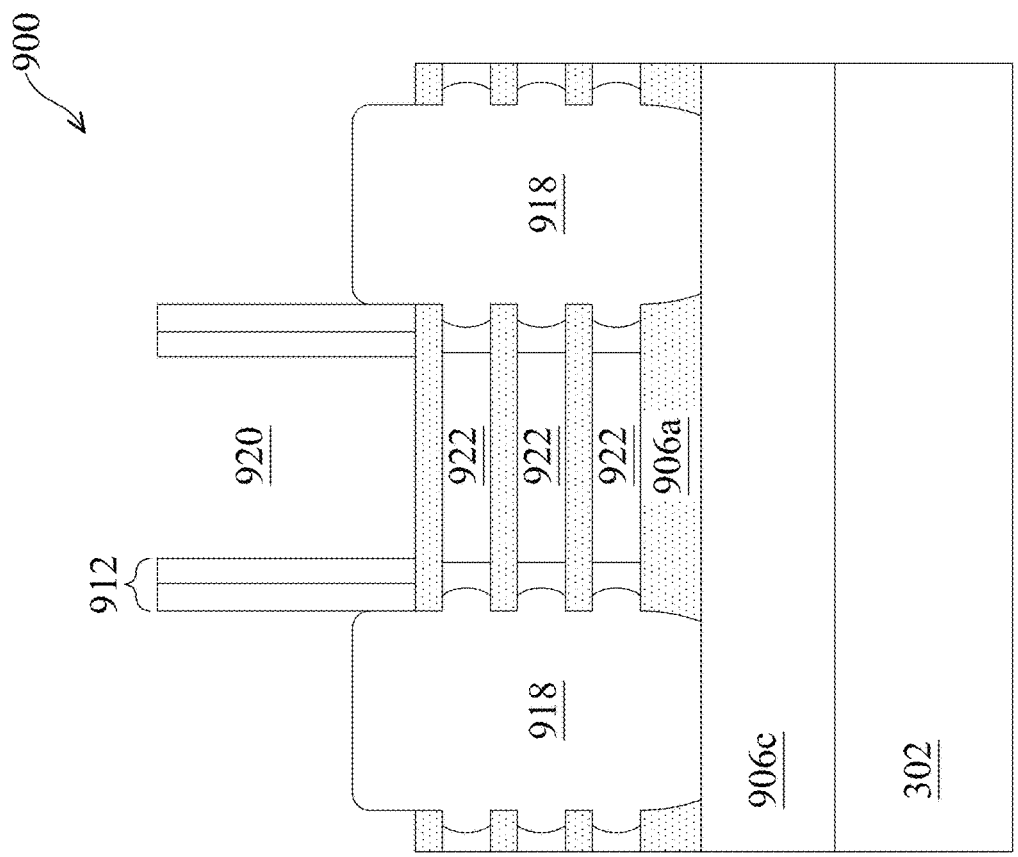
Figure 13:
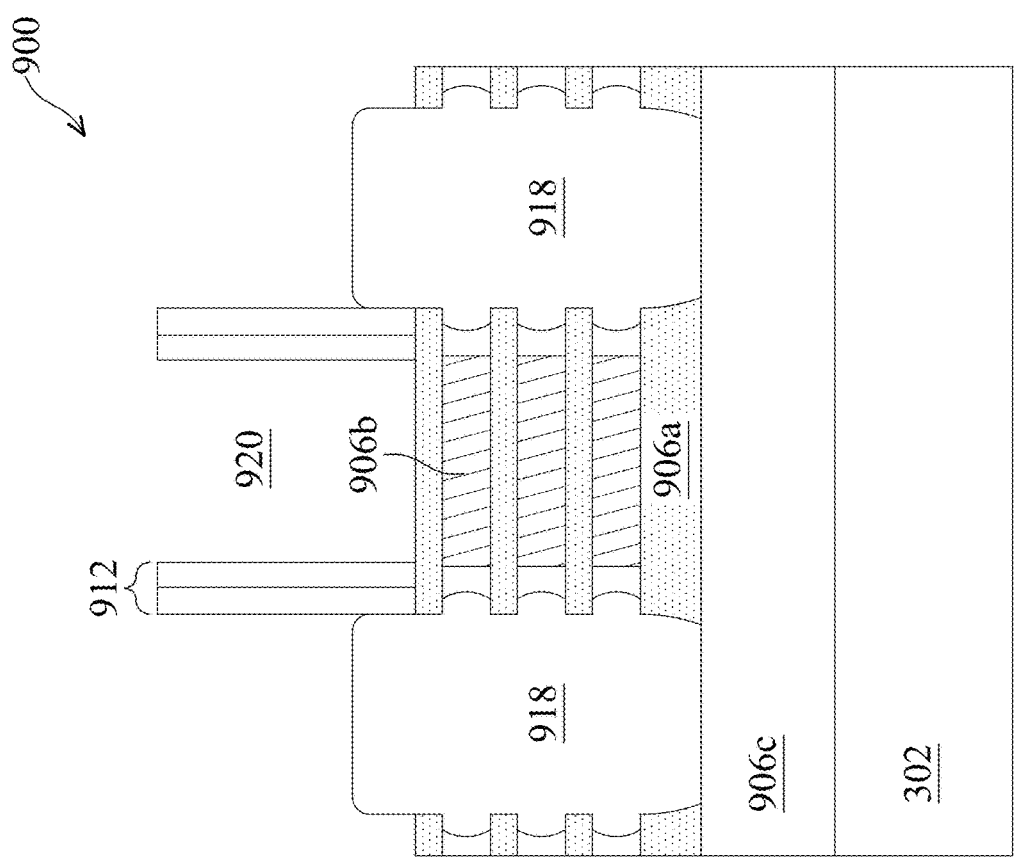

The method 800 continues in block 808 to remove the sacrificial (non-channel) layers of the multi-layer stack to provide space for a subsequently formed gate structure. After the removal of the dummy gate stacks 904 discussed above with reference to block 806, the sacrificial layers 906b are selectively removed in the channel region of the fin-shaped active region 906 to release the channel layers 906a. The removal of the sacrificial layers 906b forms gate openings 922 as illustrated in FIG. 14. The selective removal of the sacrificial layers 906b may be implemented by a selective dry etch, a selective wet etch, or other selective etching process. In some embodiments, the selective wet etching includes an APM etch (e.g., ammonia hydroxide-hydrogen peroxide-water mixture).

Figure 15:
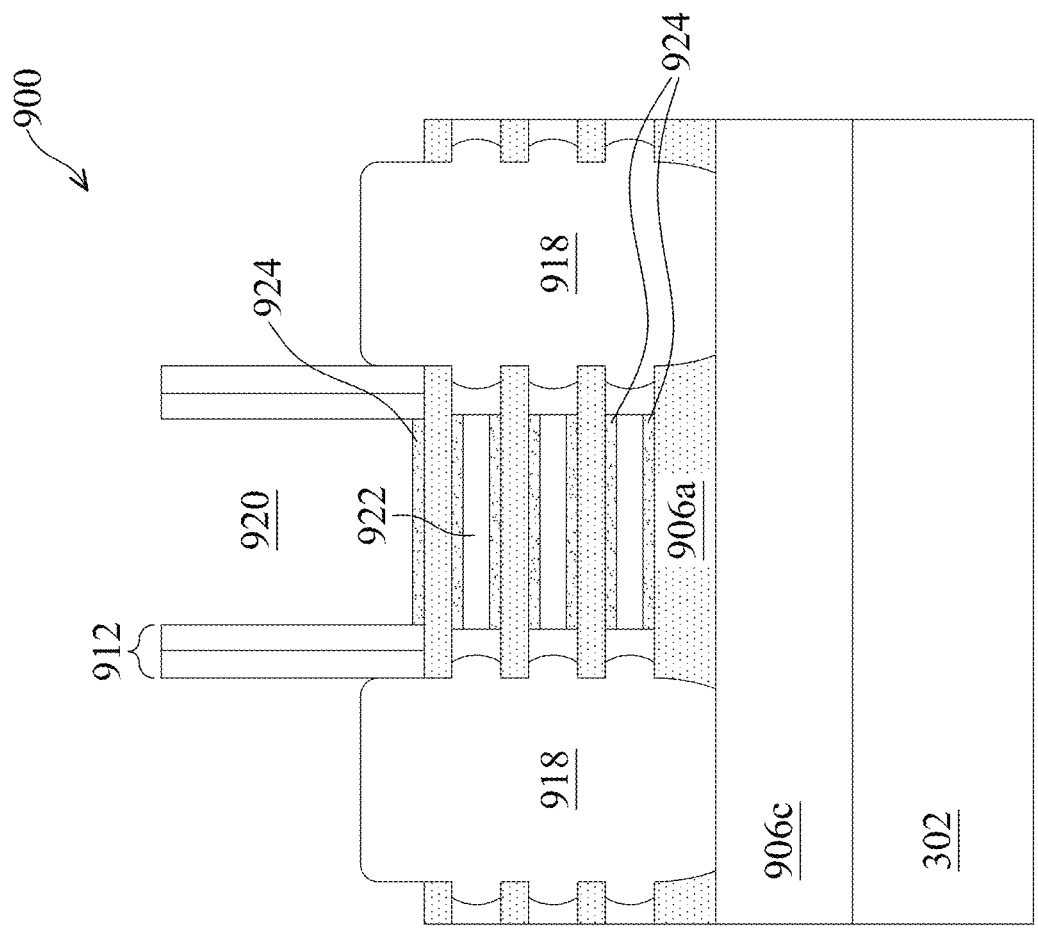

The method 800 includes forming a gate dielectric layer in block 810. In some embodiments, forming the gate dielectric layer includes forming an interfacial layer disposed on the channel regions, channel layers 906a, and forming a high-k dielectric layer over the interfacial layer. In the present disclosure, a high-k dielectric layer refers to a dielectric material having a dielectric constant greater than that of silicon dioxide, which is about 3.9. In some embodiments, the interfacial layer includes silicon oxide. The interfacial layer may be formed by oxidation or other suitable deposition process. The high-k dielectric layer may be conformally deposited using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, (Ba, Sr)$TiO_3$ (BST), silicon nitride, silicon oxynitride, combinations thereof, or other suitable material. FIG. 15 illustrates the gate dielectric layer 924, which may include an interfacial layer and/or one or more high-k dielectric layers, formed on the channel layers 906*a*.

The method 800 continues form a gate electrode over the gate dielectric layer 924. Referring to the example of FIG. 16, a gate electrode 1604 of a gate structure 1600 is formed in the openings 920 and 922. The formation of the gate structure 1600 may be performed in multiple steps including block 812, 814, and/or 816 of the method 800.

Figure 16:
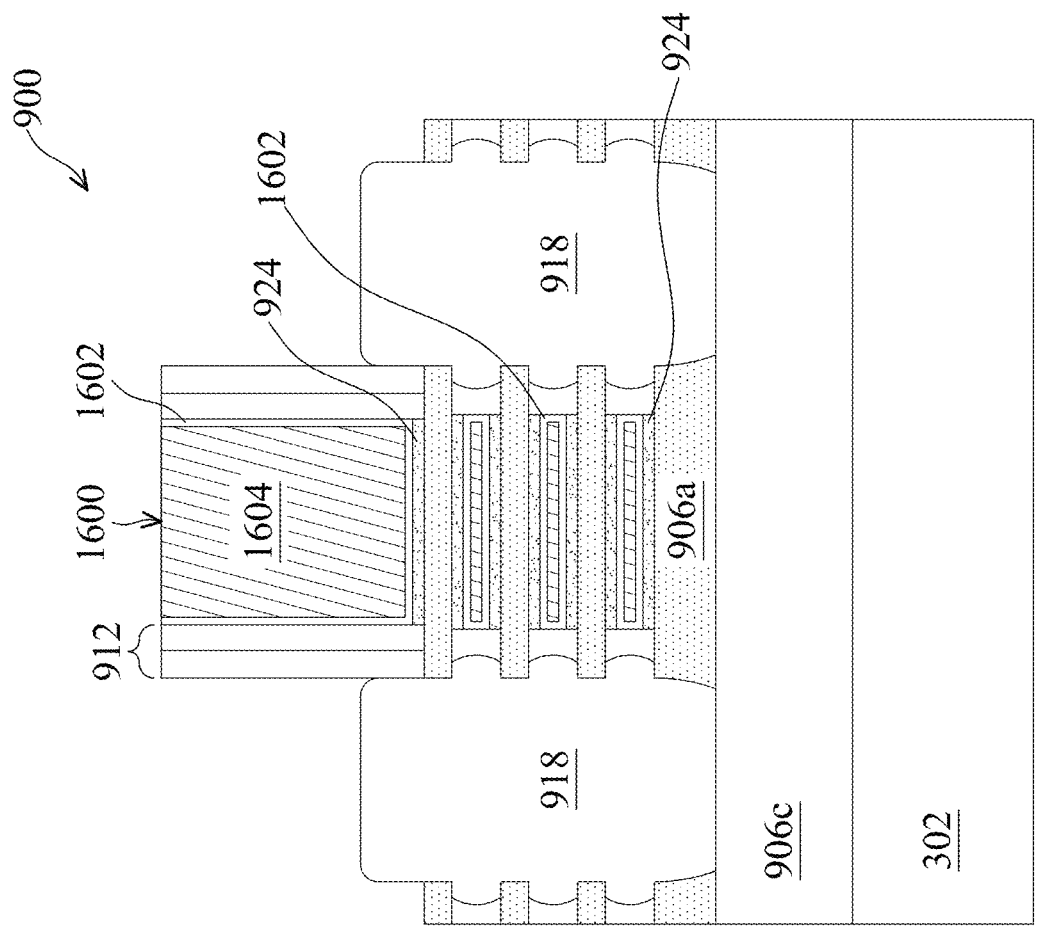

In some embodiments of the method 800, the method includes block 812 including performing a catalyzation process, which forms a catalyst layer on the surfaces of the gate dielectric. A catalyst layer 1602 is illustrated in FIG. 16. Forming the catalyst layer 1602 may be substantially similar to as discussed above with reference to block 104 of the method 100 described in FIG. 1 and/or with reference to block 206 of the method 200 described in FIG. 2. Referring to the example of FIG. 16, in an embodiment, the catalyst layer 1602 is conformally deposited. The catalyst layer 1602 may be conformally deposited by ALD, CVD, ELD, PLAD, and/or other suitable process. The catalyst layer 1602, similar to as discussed above, may include a material or materials selected from columns 8 to 12 of the periodic table (e.g., a metal such as Pt, Pd, Co, Ru, Rh, Ag, Au, Cu, Ni, and the like). The catalyst layer 1602 may be formed on the gate dielectric layer 924 and/or the spacer elements 912 (shown in FIG. 16).

In block 814 of the method 800, a selectivity enhancement process is performed. The selectivity enhancement process may be substantially similar to the selectivity enhancement process described with reference to block 106 of the method 100 illustrated in FIG. 1 and/or block 208 of the method 200 illustrated in FIG. 2. The selectivity enhancement process may include providing an accelerator, suppressor, and/or SAM prior to or concurrently with the deposition of the metal of block 816 of the method 800.

In an embodiment of block 814, a SAM is provided that binds to the exposed surface(s) of the catalyst layer 1602. A directional plasma may then be performed to remove portions of the SAM such as portions on the surfaces of the catalyst layer 1602 formed on the lower channel layers 906*a*. A metal layer is then deposited. A plurality of cycles— depositing a SAM, tuning of the location of the SAM by directional plasma, and deposition of a metal—may be performed as discussed above. This may result in a bottom-up filling of the metal layer (e.g., filling the lower openings 922, the upper openings 922, and then the opening 920). An exemplary illustration is provided in FIGS. 23A-23D.

Figure 24:
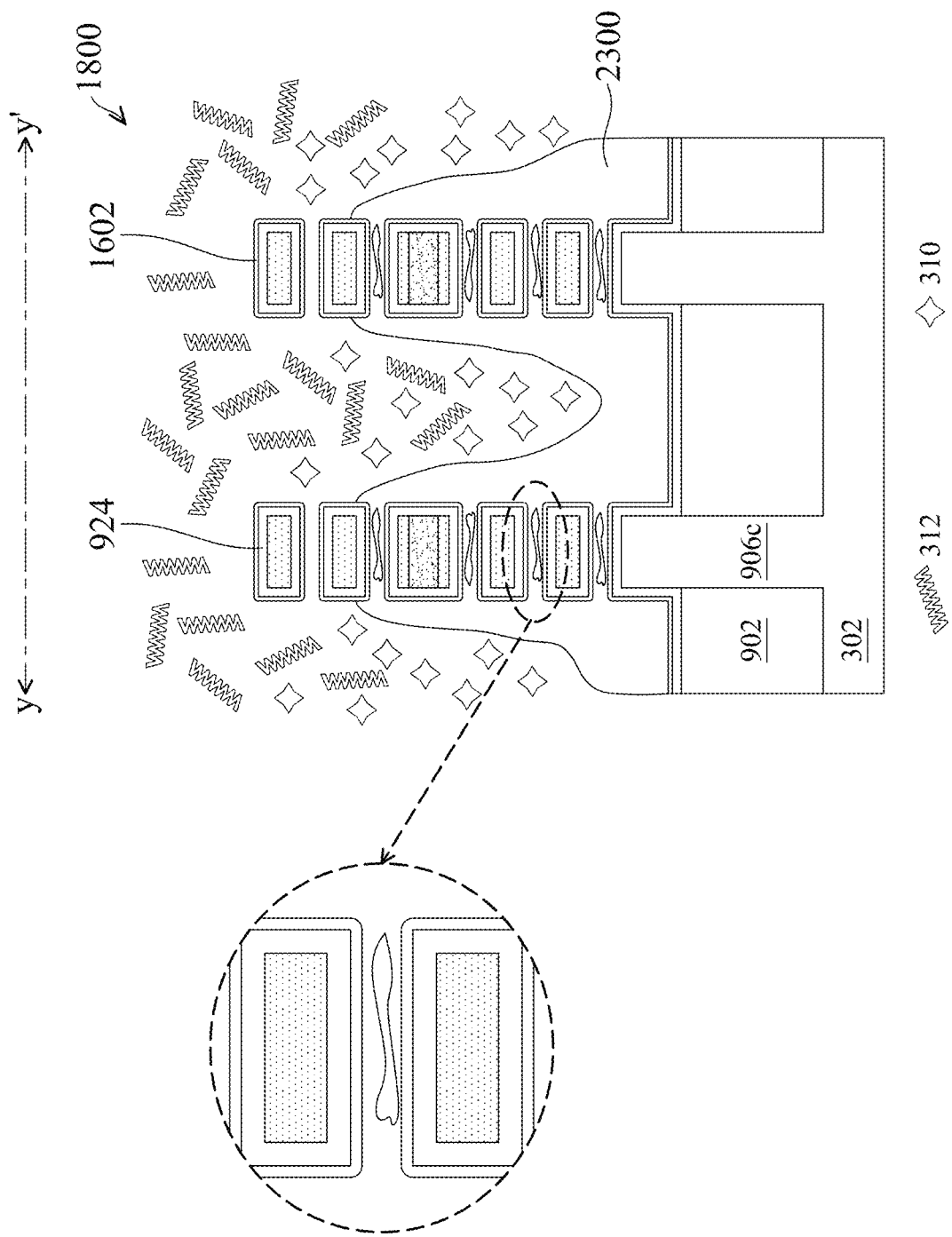

In an embodiment of block 814, an accelerator and/or a suppressor is provided with the metal deposition of block 816 of the method 800. The accelerator and/or suppressor may be substantially similar to the block 106 of the method 100 illustrated in FIG. 1 and/or block 208 of the method 200 illustrated in FIG. 2. The accelerator and/or suppressor may provide for conformal growth of the metal, increase the bottom surface growth rate of the metal, and/or otherwise control the metal deposition as discussed above. An exemplary illustration is provided in FIG. 24. In some implementations, the SAM and the accelerator/suppressor are both used to form the metal gate.

The method 800 includes block 816 where a metal gate electrode layer is formed by depositing one or more metals. A metal gate electrode layer 1604 is illustrated in FIG. 16. The gate electrode layer 1604 may be deposited by atomic layer deposition (ALD), physical vapor deposition (PVD), chemical vapor deposition (CVD), e-beam evaporation, or other suitable methods. The gate electrode layer 1604 may include a single layer or alternatively a multi-layer structure, such as various combinations of a metal layer with a selected work function to enhance the device performance (work function metal layer), a liner layer, a wetting layer, an adhesion layer, a metal alloy or a metal silicide, and/or metal fill layers. By way of example, the gate electrode layer 1604 may include W, Mo, Pt, Pd, Co, Ru, Rh, Ag, Au, Cu, Ni, Fe or alloy like NiB, NiP, CoNiP, CoNiB, CoMnP, CoNiMnP, CoWP, CoWB, CoNiReP, CoB. CoP, CoFeB, CoNiFeB, FeP, and/or other suitable metals such as titanium nitride, titanium aluminum, titanium aluminum nitride, tantalum nitride, tantalum aluminum, tantalum aluminum nitride, tantalum aluminum carbide, tantalum carbonitride, aluminum, titanium, tantalum carbide, tantalum silicon nitride, or other suitable metal materials. Further, where the device 900 includes n-type transistors and p-type transistors, different gate electrode layers may be formed separately for n-type transistors and p-type transistors, which may include different work function metal layers (e.g., for providing different n-type and p-type work function metal layers). The metal gate electrode layer 1604, the catalyst layer 1602, and the gate dielectric layer 924 form a metal gate structure 1600. It is noted that in some implementations, the metal gate structure 1600 may include impurities such as discussed above including with reference to FIG. 7C.

In some implementations, the formation of gate structure 1600 using blocks 812, 814, and 816 of the method 800 serves to provide a uniform, contiguous gate electrode layer 1604. For example, the metal gate structure 1600 is illustrated as being formed without seams or voids in FIG. 16. However, in some implementations, gaps (seams or voids) may be present between the channel layers 906*a*, such as discussed below with reference to the embodiment of device 1800.

The method 800 may include additional steps such as performing CMP process(es) to planarize the gate structure 1600, and forming a contact structure through deposited dielectric layers to the gate structure 1600 and/or source/drain features 918. Such further processes may also include forming a multi-layer interconnect (MLI) structure (not depicted) over the substrate 302. In some embodiments, the MLI structure may include multiple intermetal dielectric (IMD) or interlayer dielectric (ILD) layers and multiple metal lines or contact vias in each of the IMD layers. The metal lines and contact vias in each IMD layer may be formed of metal, such as aluminum, tungsten, ruthenium, or copper. The MLI structure may interconnect a plurality of devices such as illustrated by device 900.

Figure 19:
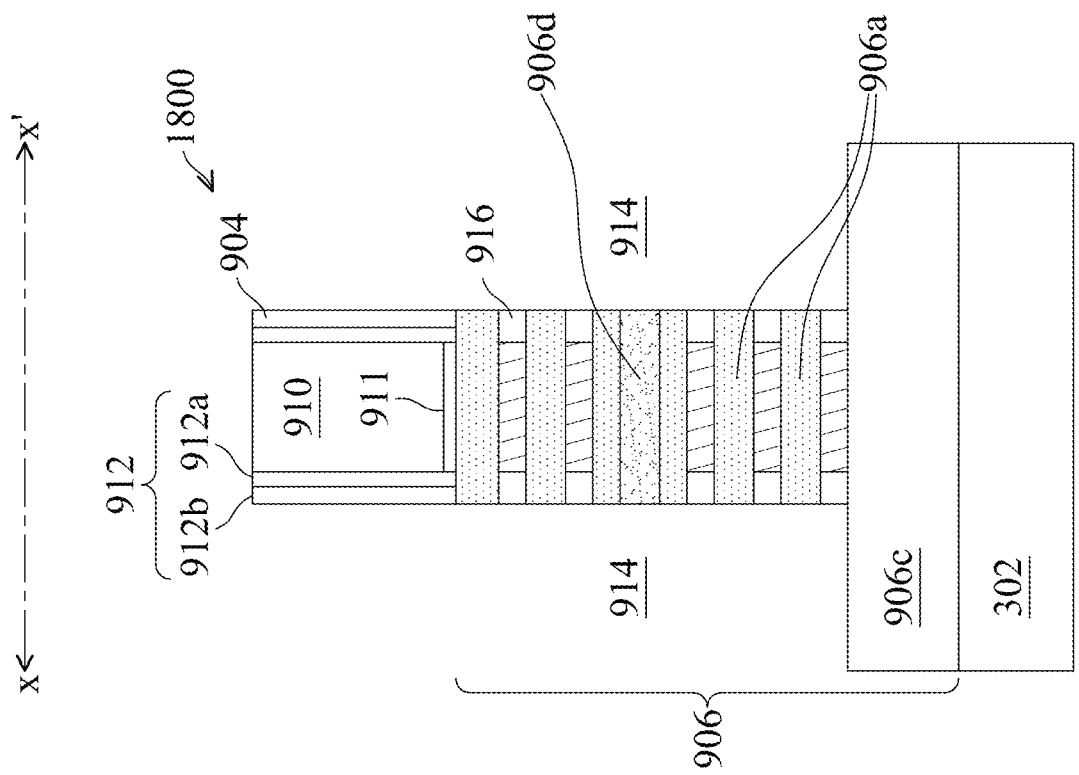
Figure 20:
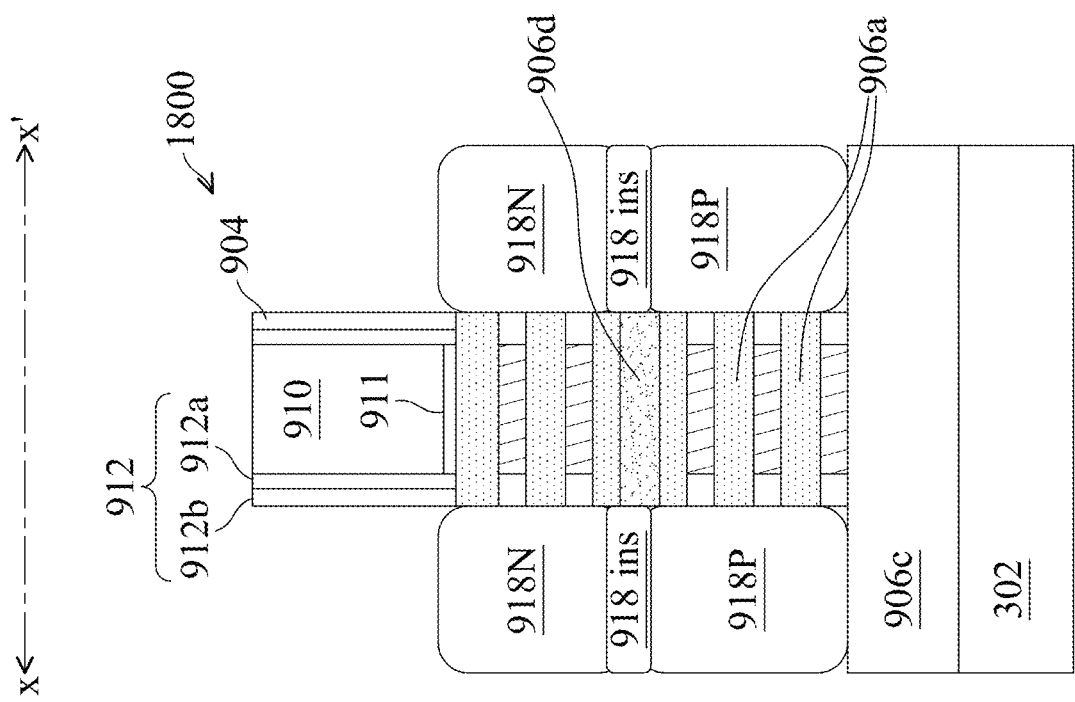

Turning now to FIG. 17, illustrated is an embodiment of a method 1700, which provides another exemplary embodiment implementing aspects of the method 100. Aspects of the method 200 of FIG. 2 and the method 800 of FIG. 8 also apply to the method 1700. In particular, embodiments of the method 1700 form a gate-all-around (GAA) structure, such as discussed with reference to the method 800, in the exemplary embodiment of FIG. 17 the GAA structure being configured as a CFET device. The CFET device provides a split-gate configuration of a GAA structure. The method 1700 is described below in conjunction with FIGS. 18A, 18B, which are a fragmentary perspective view and top view respectively of a device 1800; FIGS. 18C, 19 and 20, which are fragmentary cross-sectional views of a device 1800 along a first cut-line (X-X') at different stages of fabrication according to embodiments of the method 1700; FIGS. 21, 22, 23A, 23B, 23C, 23D, 24, 25A, 25B, 26 and 27, which are fragmentary cross-sectional views of a device 1800 along a second cut-line (Y-Y') at different stages of fabrication according to embodiments of method 1700. Method 1700 is merely an example and are not intended to limit the present disclosure to what is explicitly illustrated therein. Additional steps may be provided before, during and after the method 1700, and some steps described can be replaced, eliminated, or moved around for additional embodiments of the method. Not all steps are described herein in detail for reasons of simplicity.

The method 1700 includes a block 1702 where a dummy gate stack is formed over a multi-layer (ML) stack disposed on a semiconductor substrate, the ML including alternating channel layers and non-channel (sacrificial) layers substantially similar to as discussed above with reference to block 802 of the method 800. A middle layer is positioned within the ML stack, dividing the stack into two portions—a lower portion and an upper portion. Channel layers of the ML above the middle layer (i.e., within the upper portion) may be associated with a first type of transistor (e.g., an N-type transistor) and channel layers below the middle (i.e., within the lower portion) may be associated with a second type of transistor (e.g., P-type transistor). The number of channel layers in the ML stack, including the number of channel layers in the lower and upper portion respectively, is configured based on the desired transistor performance. Exemplary devices may include one to four channel layers in each of the lower and upper portions of the ML.

Figure 18A:
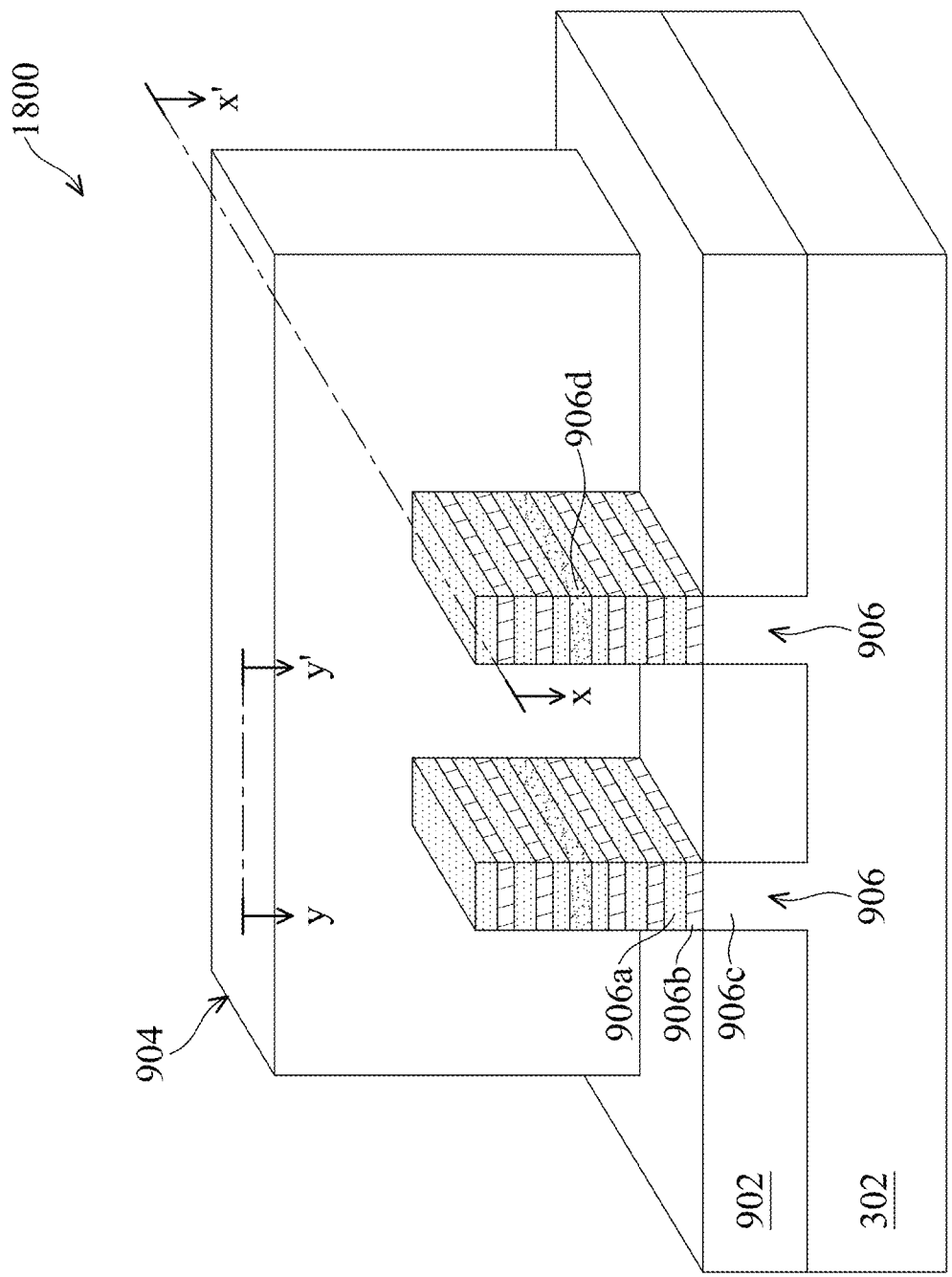
FIG. 18A illustrates a fragmentary perspective view of an embodiment of the semiconductor structure according to a stage of operation in the method of FIG. 17, according to one or more aspects of the present disclosure.
Figure 18B:
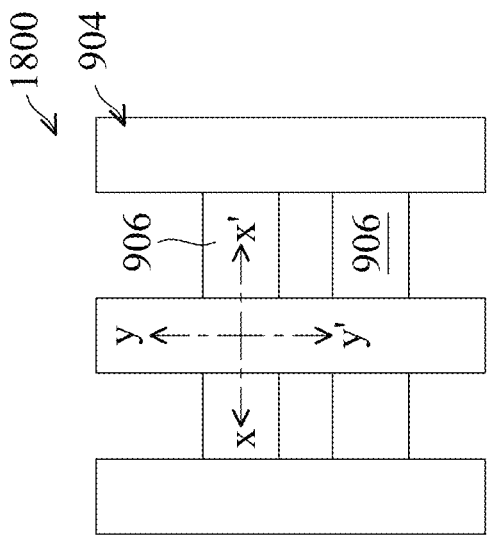
FIG. 18B illustrates a corresponding fragmentary top view, according to various aspects of the present disclosure.
Figure 18C:
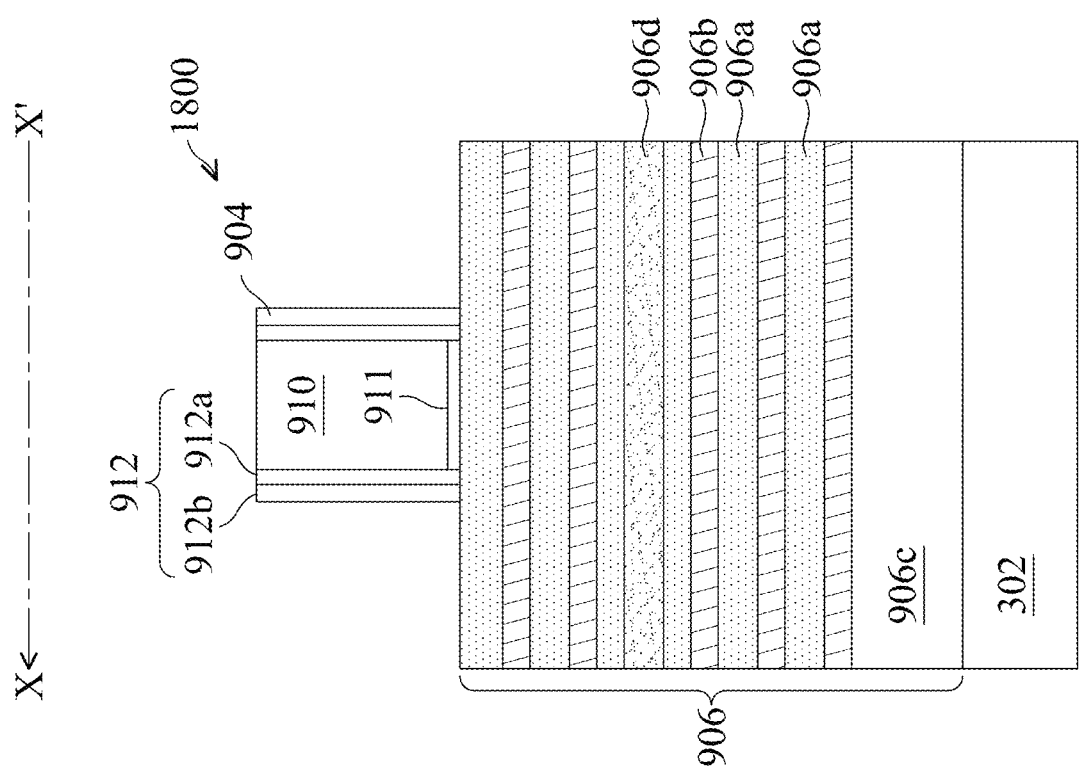
FIGS. 18C, 19 and 20 illustrate embodiment of the semiconductor structure according to a stage of operation in the method of FIG. 17 along line X-X' as shown in FIG. 18A, 18B, according to various aspects of the present disclosure.

As illustrated in the example of FIGS. 18A, 18C, the device 1800 includes a substrate 302. The substrate 302 may be substantially similar to as discussed above with reference to the substrate 302. The device 1800 includes a number of fin-shaped active regions 906 disposed over the substrate 302. The numbers of fin-shaped active regions 906 shown in FIGS. 18A and 18B are for illustration purpose only and should not be construed as limiting the scope of the present disclosure. The fin-shaped active region 906 is formed from a top portion 906c of the substrate 302 and a ML, which is a vertical stack of alternating semiconductor layers 906a and 906b. The fin-shaped active region 906 and alternating layers 906a, channel layers, and 906b, sacrificial layers, may be substantially similar to as discussed above with reference to the method 800 of FIG. 8. A middle layer 906d is formed within the vertical stack of alternating semiconductor layers 906a and 906b. The channel layers 906a disposed above the middle layer 906d are associated with a transistor of a first type (e.g., nFET) and the channel layers 906a below the middle layer 906d are associated with a transistor of a second type (e.g., pFET). The middle layer 906d provides a gate stack spacer, which when forming the gate structure as discussed below, isolates the upper portion of the gate stack (e.g., nFET) from the lower portion of the gate stack (e.g., pFET). The middle layer 906d may be an insulating material.

The device 1800 includes the isolation feature 902 (shown in FIG. 18A), dummy gate stacks 904 (shown in FIGS. 18A, 18B, 18C), and spacer elements 912 (shown in FIG. 18C), which each may be substantially similar to as discussed above with reference to the method 800 and the device 900.

The method 1700 includes block 1704 where source/drain features are formed. The block 1704 may be substantially similar to the block 804 of the method 800 discussed above. Referring to exemplary FIG. 19, in an embodiment, the fin-shaped active regions 906 are recessed to form source/drain openings 914. In some implementations, sacrificial layers 906b are recessed and inner spacers 916 are formed. In other implementations, oxidation of sacrificial layers 906b forms the inner spacers 916.

Block 1704 also forms source/drain features 918 in the source/drain openings 914. In some implementations the method 1700 is directed to forming a CFET, and as such source/drain features corresponding to two device types may be formed in the source/drain opening 914. As illustrated by exemplary FIG. 20, a first source/drain feature 918P may be formed in a lower portion of the source/drain opening 914 and a second source/drain feature 918N may be formed in an upper portion of the source/drain opening 914. In an embodiment, the second source/drain feature 918N is an n-type source/drain feature and the first source/drain feature 918P is a p-type source/drain feature; however, the opposite configuration may also be provided. Exemplary n-type source/drain features 918N may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features 918P may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. Although not separately labeled, the source/drain features 918P/918N may include multiple epitaxial semiconductor layers having different dopant concentrations. An insulating region 918_ins is disposed between the source/drain regions of opposing type to provide isolation between the two devices. In some implementations, a contact etch stop layer (CESL) and an interlayer dielectric (ILD) layer are also formed (not illustrated) over the source/drain features 918P/918N.

Figure 21:
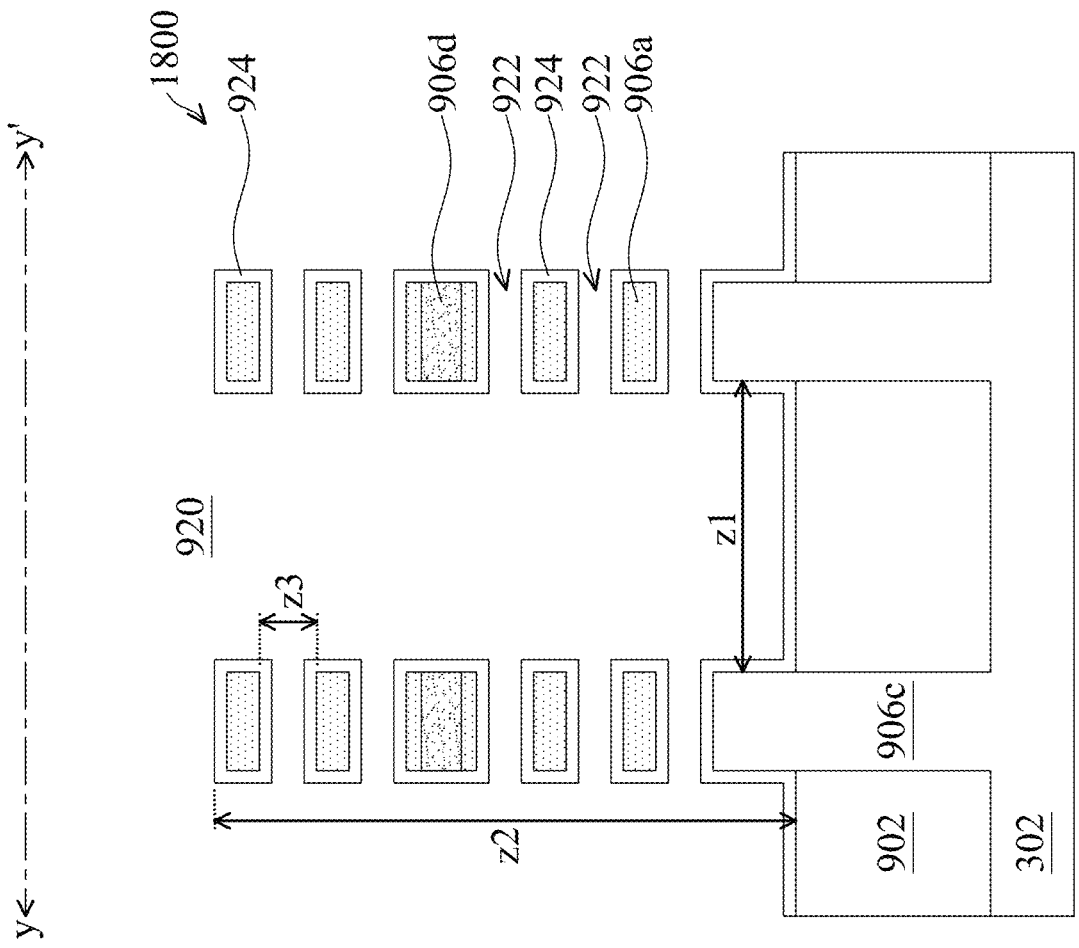
FIGS. 21, 22, 23A, 23B, 23C, 23D, 24, 25A, 25B, 26 and 27 illustrate embodiment of the semiconductor structure according to a stage of operation in the method of FIG. 17 along line Y-Y' as shown in FIGS. 18A, 18B, according to various aspects of the present disclosure.

The method 1700 proceeds to block 1706, which includes removing the dummy gate stack to form a gate trench and removing the sacrificial (non-channel) layers of the multi-layer stack to provide space for a subsequently formed gate structure. Block 1706 may be substantially similar to blocks 806 and 808 of the method 800 described in FIG. 8 above. Referring to the example of FIG. 21, the dummy gate stacks 904 have been removed to form an opening 920. After the removal of the dummy gate stacks 904, the sacrificial layers 906b are selectively removed to release the channel layers 906a in the channel regions of the fin-shaped active regions 906. The removal of the sacrificial layers 906b forms gate openings 922 as illustrated in FIG. 21. It is noted that FIG. 21 cross-sectional view is perpendicular the extending direction of the fin-shaped active regions 906.

Exemplary dimensions applicable to an embodiment of the device 1800 are illustrated with respect to FIG. 21; these dimensions are exemplary only and not intended to be limiting beyond what is specifically recited in the claims that follow. In an embodiment, a distance z1 between fin-shaped active regions 906 is between approximately 10 nanometers (nm) and 25 nm. In an embodiment, the fin-shaped active region 906 has a height z2 above the isolation feature 902; the height z2 may be between approximately 80 nm and 200 nm. In an embodiment, the channel layers 906a are spaced apart by a vertical distance z3 of between approximately 5 nm to 15 nm.

The method 1700 then proceeds to form a gate structure within the trench/openings. The formation of the gate structure can include a plurality of blocks including blocks 1708-1722, and in some implementations, certain of the blocks are omitted and/or other steps are performed.

In an embodiment, the method 1700 includes forming a gate dielectric layer in block 1708. In some embodiments, the gate dielectric layer includes an interfacial layer disposed on the channel regions—channel layers 906a—and a high-k dielectric layer is formed is over the interfacial layer. The gate dielectric layers may be substantially similar to as discussed above with reference to block 810 of the method 800. Exemplary FIG. 21 illustrates the gate dielectric layer 924, which may include an interfacial layer and/or one or more high-k dielectric layers.

Figure 22:
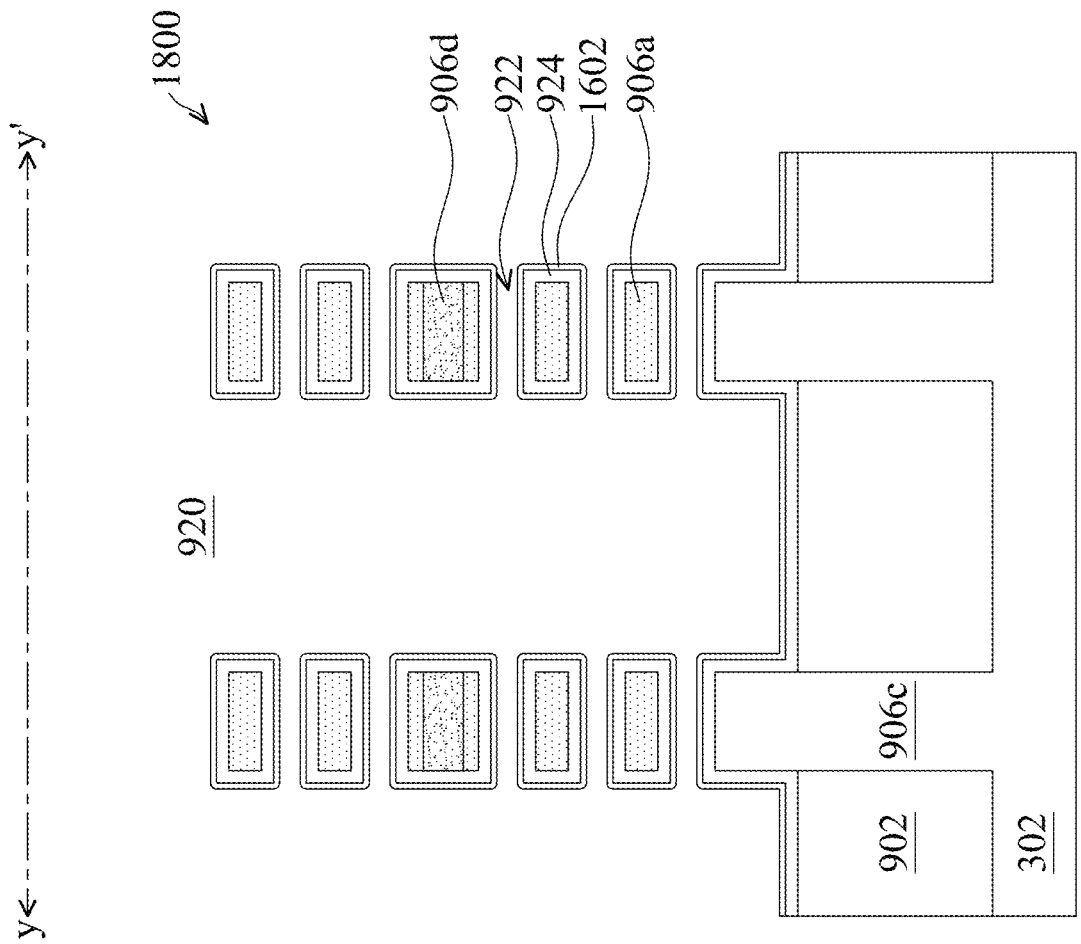

In block 1710 of an embodiment of the method 1700, a catalyzation process is performed, which forms a catalyst layer on surfaces of the gate dielectric over the channel regions. Block 1710 may be substantially similar to block 104 of the method 100 of FIG. 1; block 206 of the method 200 of FIG. 2; and/or block 812 of the method 800 of FIG. 8. FIG. 22 illustrates a catalyst layer 1602. The catalyst layer 1602 may be substantially similar to exemplary catalyst layer 308A, 308B of FIGS. 2, 4A, 4B; and/or exemplary catalyst layer 1602 of FIGS. 8 and 16. In an embodiment, the catalyst layer 1602 is conformally deposited (shown in FIG. 22). The catalyst layer 1602 may be conformally deposited by ALD, CVD, ELD, PLAD, and/or other suitable process. The catalyst layer 1602, as discussed above, may include a material or material(s) selected from columns 8 to 12 of the periodic table (e.g., a metal such as Pt, Pd, Co, Ru, Rh, Ag, Au, Cu, Ni, and the like). The catalyst layer 1602 may be formed directly the gate dielectric layer 924. The catalyst layer 1602 may also be formed on sidewalls of the gate trench defined by gate spacers (similar to as illustrated in FIG. 16).

In block 1712 of the method 1700, a selectivity enhancement process is performed. The selectivity enhancement process may be substantially similar to the selectivity enhancement process described with reference to block 106 of the method 100 illustrated in FIG. 1; block 208 of the method 200 illustrated in FIG. 2; and/or block 814 of the method 800 illustrated in FIG. 8. The selectivity enhancement process may include providing an accelerator, suppressor, and/or SAM prior to or concurrently with the deposition of metal in block 1714 of the method 1700.

In an embodiment of block 1712, the selectivity enhancement process includes forming a SAM on a surface of the catalyst layer 1602. A selectivity enhancement process including forming a SAM is discussed above including with reference to block 106 of the method 100 of FIG. 1. In an embodiment, the SAM may include a polymer chain with a functional group such as dithiothreitol, 3-(trimethoxysilyl) propanethiol, or other suitable functional groups operable to act as an inhibitor to the subsequent metal deposition.

After forming a SAM, the selectivity enhancement process may continue to provide a directional treatment (e.g., plasma) to remove portions of the SAM. In an implementation, bottom up growth of the subsequently formed metal layer (block 1714) is desired. As such, the directional treatment removes the SAM from a bottom of the opening provided by the release of the channel layers and removal of the dummy gate. After tuning the location of the SAM, a first portion of a metal layer is deposited. This process may be repeated until a desired metal layer thickness is formed.

Figures 23A, 23B:
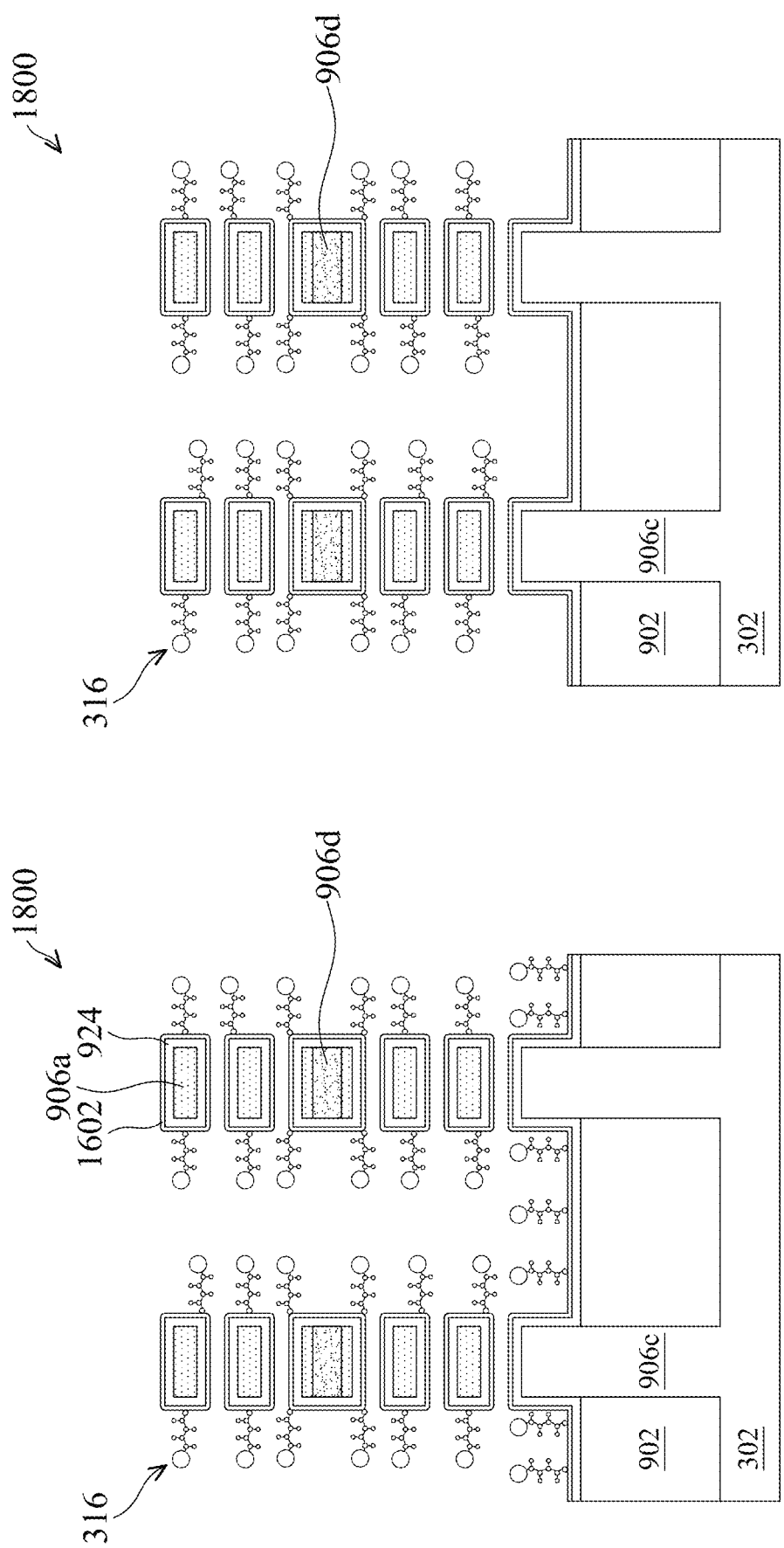
Figure 23D:
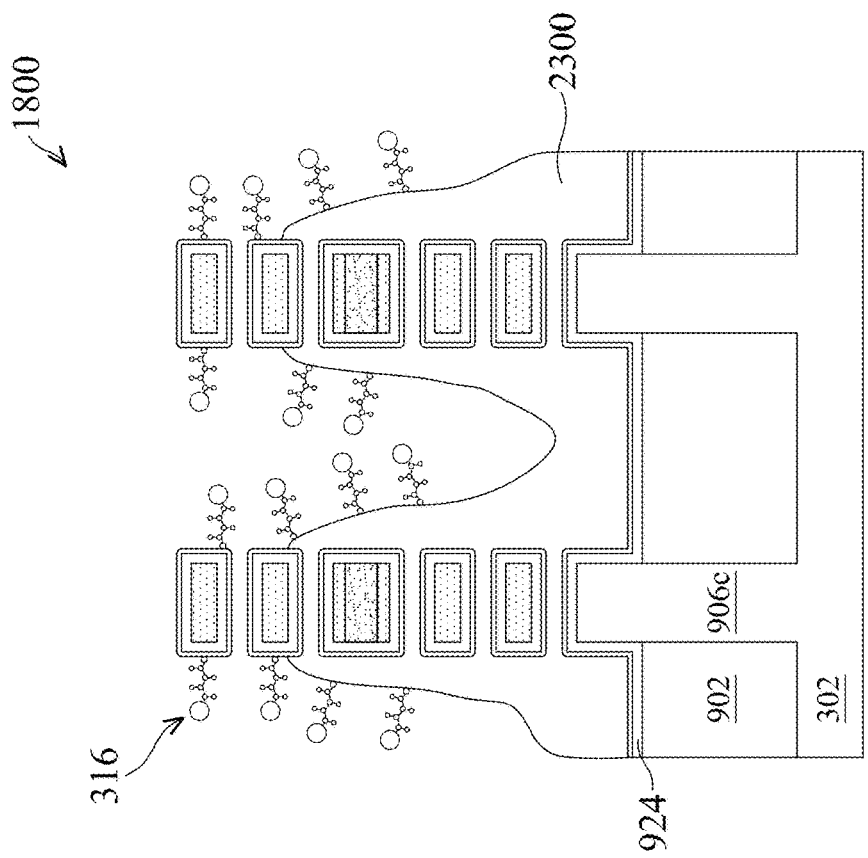
Figure 23C:
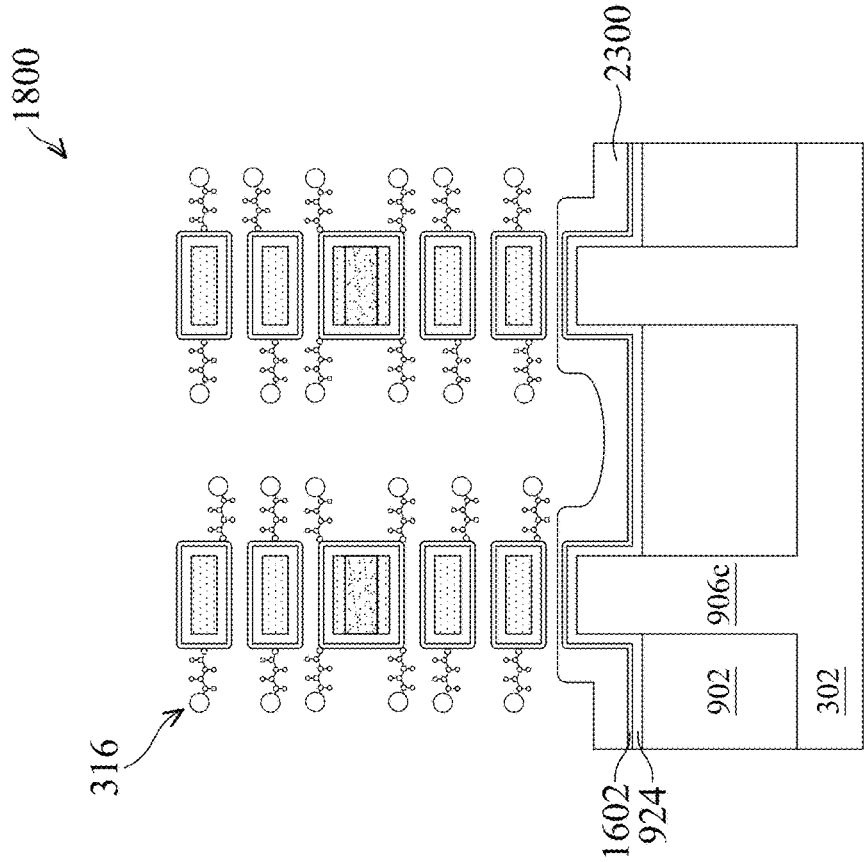

The selectivity enhancement process including a SAM is illustrated in exemplary FIGS. 23A, 23B, 23C, and 23D. In FIG. 23A, a SAM 316 is formed on the substrate 302 and in particular on the catalyst layer 1602. FIG. 23B illustrates the SAM 316 after a directional treatment has tuned the location of the SAM 316 by removing the SAM 316 at a lower portion of the opening 920 of FIG. 23B. As discussed above, the removal may be performed by a directional plasma such as Ar, $N_2$, He, $H_2$ generated plasmas. As illustrated in FIG. 23C, a metal layer 2300 is then partially deposited (described with reference to block 1714).

Figure 25A:
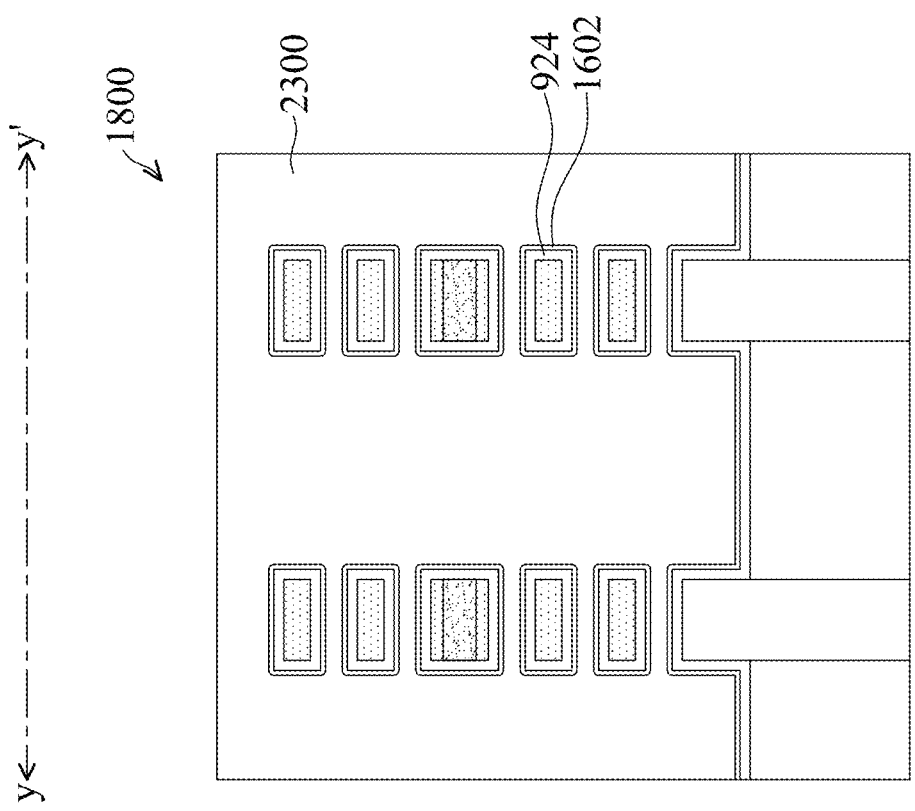
Figure 25B:
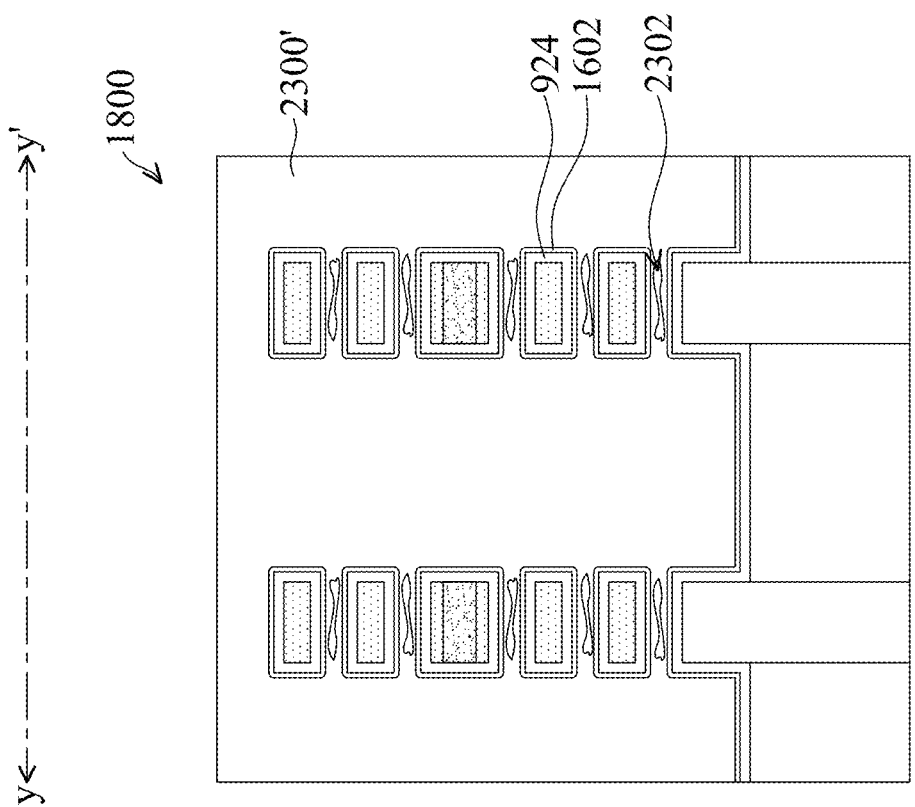

Any number of these cycles—depositing SAM, tuning of the location of the SAM by directional plasma or other suitable methods, and deposition of a metal—may be performed to fill the openings 920, 922 with the metal layer 2300. As illustrated by FIG. 23D, subsequent deposition and tuning of the SAM 316 may include depositing the SAM 316 on portions of the metal layer 2300 already deposited. FIGS. 25A, 25B, discussed below, illustrate the metal layer 2300 filling the openings 920, 922.

In an embodiment of block 1712 of the method 1700, the selectivity enhancement process performed includes introducing an accelerator and/or a suppressor. The accelerator/suppressor may be introduced concurrently with the deposition of the metal discussed with reference to block 1714. The accelerator and/or suppressor may provide for conformal growth of the metal, increase the bottom surface growth rate of the metal, and/or otherwise control the metal deposition. In some implementations, the SAM and the accelerator/suppressor are both performed in block 1712 (i.e., both (FIGS. 23A-23D and FIG. 24) implemented to form a single metal gate). In other embodiments, one selectivity enhancement is performed (i.e., SAM as shown in FIGS. 23A-23D or accelerator/suppressor of FIG. 24.

Providing the accelerator and/or suppressor may be substantially similar to as discussed above with reference to block 106 of the method 100 of FIG. 1. As illustrated in exemplary FIG. 24, accelerator 310 and suppressor 312 are provided during the deposition of the metal layer 2300, discussed with reference to block 1714. As discussed above with reference to FIG. 1, in an embodiment, the accelerator is one of SPS and/or MPS and in an embodiment, the suppressor is one of PEG and/or PPG.

The method 1700 includes block 1714 where metal(s) of a gate stack of a first type is deposited in the gate trench and openings. As discussed above, block 1712 and block 1714 may be performed concurrently and/or iteratively. The metal of the gate stack may be formed by ALD, PVD, CVD, e-beam evaporation, and/or other suitable methods. The metal of the gate stack may be one or more gate electrode layers. The metal is illustrated in FIGS. 23C, 23D, 24, 25A, and 25B as exemplary gate electrode layer 2300. The gate electrode layer 2300 may include a single layer or alternatively a multi-layer structure, such as various combinations of a metal layer with a selected work function to enhance the device performance (work function metal layer), a liner layer, a wetting layer, an adhesion layer, a metal alloy, a metal silicide, fill metal, and/or other suitable conductive materials. By way of example, the gate electrode layer 2300 may include W, Mo, Pt, Pd, Co, Ru, Rh, Ag, Au, Cu, Ni, Fe or alloy like NiB, NiP, CoNiP, CoNiB, CoMnP, CoNiMnP, CoWP, CoWB, CoNiReP, CoB. CoP, CoFeB, CoNiFeB, FeP, and/or other suitable metals. Other exemplary compositions include titanium nitride, titanium aluminum, titanium aluminum nitride, tantalum nitride, tantalum aluminum, tantalum aluminum nitride, tantalum aluminum carbide, tantalum carbonitride, aluminum, titanium, tantalum carbide, tantalum silicon nitride, or other suitable metal materials. In an embodiment, the gate electrode layer 2300 includes a p-type work function material suitable for forming a gate electrode for a pFET device. It is noted that in some implementations, the gate electrode layer 2300 may include impurities such as discussed above including with reference to FIG. 7C. For example, materials such as B, P, W, Sn, Mo and/or by-products thereof could be found in the gate electrode layer 2300. In some implementations, these materials originate from reducing agents such as HCHO, $N_2H_4$, DMAB, $H_2PO_2^-$, $BH_4^-$ solutions. As another example, materials such as C, S, O, N or Si residues may be found between catalyst layer 1602 and gate electrode layer 2300. In some implementations, these materials originate from the accelerator/suppressor compositions.

The gate electrode layer 2300 may be formed of contiguous metallization without seams or voids as shown in FIG. 25A. In some implementations, the formation of the gate electrode layer 2300 using blocks 1710, 712, and 1714 of the method 1700 serves to provide this contiguous gate electrode layer 2300 due to the controlled formation of the metal(s) of gate electrode layer 2300 (e.g., bottom up growth). FIG. 25B illustrates an embodiment of the device 1800' having seams (or gaps or voids) 2302 in the gate electrode layer 2300'. The seams 2302 are present between the channel layers 906a. These seams 2302 may be confined to the openings 922 where the sacrificial layers 906b previously occupied. In some implementations, the seams 2302 do not extend outside of a region defined by a first plane colinear with a first vertical sidewall of the channel layers 906a and a second plane colinear with a second vertical sidewall of the channel layers 906a. The seams 2302 extend longitudinally (e.g., parallel a top surface of the substrate 302) within the region between channel layers 906a. It is noted that the devices 1800 and 1800' are each without vertically extending seams and without seams over the isolation feature 902 between fin-shaped active region 906.

Figure 26:
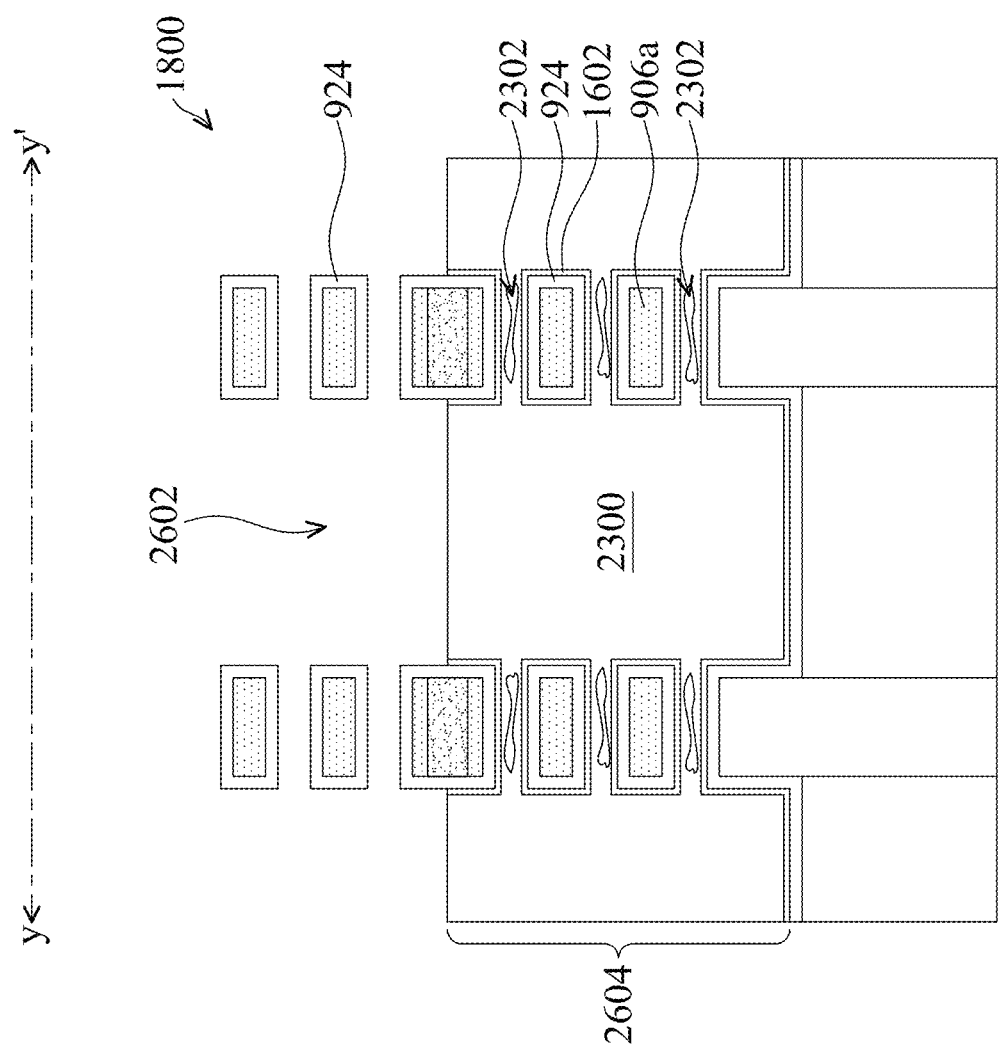

In some embodiments, the method 1700 then proceeds to block 1716 where the metal of the gate stack of the first type is recessed. In some implementations, after the deposition of block 1714, a CMP process is performed to planarize the gate electrode layer of the first type. After the CMP process, the gate stack may be etched back to expose upper portion of the channel regions, in particular those channel regions associated with the second device type. FIG. 26 illustrates the gate electrode layer 2300 etched back forming opening 2602 as illustrated in FIG. 26. In an implementation, the gate electrode layer 2300 and the catalyst layer 1602 are removed exposing a gate dielectric layer 924 on the upper portion of the channel layers 906a. In other embodiments, the gate dielectric layer 924 may also be removed and a new gate dielectric formed. The etched back gate electrode layer 2300 forms a first gate structure 1600. In an embodiment, the opening 2602 extends to provide a bottom surface of the opening 2602 (e.g., a top surface of the etched back gate 2604) coplanar with the middle layer 906d.

The etched back metal of the gate stack of the first type forms gate 2604. The gate 2604 includes the gate dielectric layer 924 and gate electrode layer 2300 and the catalyst layer 1602, which together form a conductive gate electrode. In some implementations, the gate 2604 provides a gate of a pFET. The channel regions 906a surrounded by the gate 2604 provide channel of the pFET. It is noted that the exemplary embodiment of FIG. 26 illustrates seams 2302, however, in other embodiments one or more, or all, of the seams 2302 are omitted.

The method 1700 may be beneficial in some implementations as the metal layer 2300 is formed without seams for example, overlying the isolation feature 902 or vertically extending seams. In other words, seams 2302 are in some implementations confined to between the channel layers 906a. In doing so, the metal layer 2300 provides a contiguous material for etching back. Thus, the etching back may be substantially consistent creating a planar top surface. In contrast, seams or voids disposed laterally between the fin-shaped active regions 906 would have provided an uneven metal for etching back resulting in an inconsistent profile and a non-planar surface (e.g., void/seam areas having a faster etching rate).

In some implementations, the method 1700 proceeds to block 1718 where a catalyzation process is performed forming a catalyst layer over the exposed channel regions. Referring to the example of FIG. 27, a catalyst layer 1602' is formed over the exposed channel regions 906a disposed above the metal gate 2604. Forming the catalyst layer 1602' may be substantially similar to as discussed above with reference to block 104 of the method 100 described in FIG. 1, with reference to block 206 of the method 200 described in FIG. 2, and/or with reference to block 812 of the method 800 described in FIG. 8. In an embodiment, the catalyst layer 1602' is conformally deposited on the exposed channel regions 906a. The catalyst layer 1602' may be conformally deposited by ALD, CVD, ELD, PLAD, and/or other suitable process. The catalyst layer 1602', similar to as discussed above, may be a material(s) selected from columns 8 to 12 of the periodic table (e.g., a metal such as Pt, Pd, Co, Ru, Rh, Ag, Au, Cu, Ni, and the like). In an embodiment, the catalyst layer 1602' has a different composition that the catalyst layer 1602 of the gate 2604.

The method 1700 then proceeds to block 1720 where a selectivity enhancement process is performed. The selectivity enhancement process may be substantially similar to the selectivity enhancement process described with reference to block 106 of the method 100 illustrated in FIG. 1, block 208 of the method 200 illustrated in FIG. 2, and/or block 1712 discussed above. The selectivity enhancement process may include providing an accelerator, suppressor, and/or SAM prior to or concurrently with the deposition of the metal of block 1722.

In an embodiment of block 1720, a SAM is formed on a surface of the catalyst layer 1602'. A selectivity enhancement process including a SAM is discussed above including with reference to block 106 of the method 100 of FIG. 1. In an embodiment, the SAM may be a polymer chain with a functional group such as dithiothreitol, 3-(trimethoxysilyl) propanethiol, or other suitable functional groups operable to act as an inhibitor to the subsequent metal deposition.

After forming a SAM, the selectivity enhancement process continues to provide a directional treatment (e.g., plasma) to remove portions of the SAM. In an implementation, bottom up growth of the subsequently formed metal layer is desired. As such, the directional treatment removes the SAM from a bottom of the opening 2602 (e.g., top of the gate 2604). After tuning the location of the SAM layer, a first portion of a metal layer of block 1720 is deposited. Any number of these cycles—depositing SAM, tuning of the location of the SAM by directional plasma or other suitable methods, and deposition of a metal—may be performed to fill the opening 2602 with metal layer 2300'.

In an embodiment of block 1720, the selectivity enhancement process performed includes introducing an accelerator and/or a suppressor. The accelerator/suppressor may be introduced concurrently with the deposition of the metal discussed with reference to block 1722. The accelerator and/or suppressor may provide for conformal growth of the metal, increase the bottom surface growth rate of the metal, and/or otherwise control the metal deposition. In some implementations, the SAM and the accelerator/suppressor are both performed in block 1720 (i.e., both implemented to form a single metal gate).

Providing the accelerator and/or suppressor may be substantially similar to as discussed above with reference to block 106 of the method 100 of FIG. 1 and/or block 1712 discussed above. For example, as discussed above, in an embodiment, the accelerator is one of SPS and/or MPS and in an embodiment, the suppressor is one of PEG and/or PPG.

Figure 27:
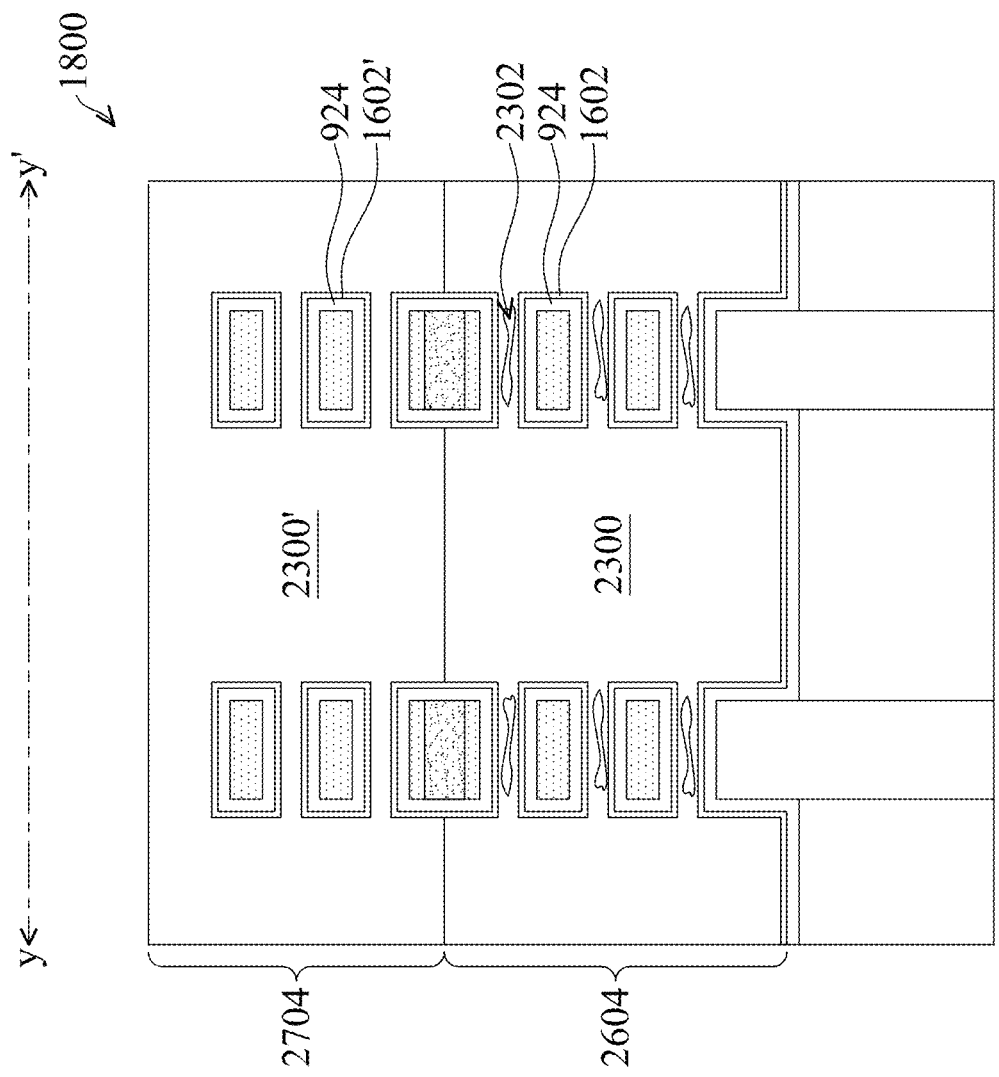

The method 1700 includes block 1722 where metal(s) of a gate stack of a second type is formed over the metal gate stack of the first type. As discussed above, block 1720 and block 1722 may be performed concurrently and/or iteratively. The metal of the second gate stack may be formed by ALD, PVD, CVD, e-beam evaporation, and/or other suitable methods. The metal of the second gate stack may be one or more gate electrode layers. Gate electrode layer 2300' is illustrated in the example of FIG. 27. The gate electrode layer 2300' may include a single layer or alternatively a multi-layer structure, such as various combinations of a metal layer with a selected work function to enhance the device performance (work function metal layer), a liner layer, a wetting layer, an adhesion layer, a metal alloy or a metal silicide. In some implementations, the gate electrode layer 2300' may also include a fill metal layer disposed over one or more layers of work function metal. By way of example, the gate electrode layer 2300' may include W, Mo, Pt, Pd, Co, Ru, Rh, Ag, Au, Cu, Ni, Fe or alloy like NiB, NiP, CoNiP, CoNiB, CoMnP, CoNiMnP, CoWP, CoWB, CoNiReP, CoB. CoP, CoFeB, CoNiFeB, FeP, and/or other suitable metals. Other exemplary compositions include titanium nitride, titanium aluminum, titanium aluminum nitride, tantalum nitride, tantalum aluminum, tantalum aluminum nitride, tantalum aluminum carbide, tantalum carbonitride, aluminum, titanium, tantalum carbide, tantalum silicon nitride, or other suitable metal materials. In an embodiment, the gate electrode layer 2300' includes a n-type work function suitable for forming a gate electrode for a nFET device. It is noted that in some implementations, the gate electrode layer 2300' may include impurities such as discussed above including with reference to FIG. 7C. For example, materials such as B, P, W, Sn, Mo and/or by-products thereof could be found in the gate electrode layer 2300'. In some implementations, these materials originate from reducing agents such as HCHO, $N_2H_4$, DMAB, $H_2PO_2^-$, $BH_4^-$ solutions. As another example, materials such as C, S, O, N or Si residues may be found between catalyst layer 1602' and gate electrode layer 2300'. In some implementations, these materials originate from the accelerator/suppressor compositions.

The gate dielectric layer 924, the catalyst layer 1602' (if present) and the gate electrode layer 2300' form a gate structure 2704. In some implementations, the gate 2702 provides a gate of an nmos transistor. The channel regions 906a surrounded by the gate 2604 provide channel of the nmos transistor. In an embodiment, as illustrated in FIG. 27, seams 2302 are present between channel regions 906a of the first metal gate structure 2604. In a further embodiment, seams are not present between channel regions 906a of the second metal gate structure 2704. Other combinations of the presence of seams is also possible.

In an embodiment of the method 1700, blocks 1718 and 1720 are omitted. That is, in some embodiments, after etching back the metal gate of a first type, the metal gate of a second type is formed through deposition of metal without catalyzation process and/or the selectivity enhancement process. In some implementations, a determination of whether to perform block 1718 and/or block 1720 may be determined based on the aspect ratio of the opening 2602 and/or desired resistivity performance of the metal gate 2704.

In some embodiments, a dielectric cap layer (or other isolating feature) is formed between the first gate structure 2604 and the second gate structure 2704. In other implementations, the first gate structure 2604 and the second gate structure 2704 abut one another.

The device 1800 provides a CFET device having a transistor of a first type formed by gate structure 2604 and a transistor of a second type formed by gate structure 2704 disposed vertically over the gate structure 2604. Source/drain features 918P correspond with the gate structure 2604 and the source/drain features 918N correspond with the gate structure 2704.

The method 1700 may include additional steps such as performing CMP process to planarize the gate structure 2704, and forming a contact structure through deposited dielectric layers to the gate structure 2704. Such further processes may also include forming a multi-layer interconnect (MLI) structure (not depicted) over the substrate 302. In some embodiments, the MLI structure may include multiple intermetal dielectric (IMD) or interlayer dielectric (ILD) layers and multiple metal lines or contact vias in each of the IMD layers. The metal lines and contact vias in each IMD layer may be formed of metal, such as aluminum, tungsten, ruthenium, or copper. The MLI structure may interconnect a plurality of devices such as illustrated by device 1800.

Referring to FIGS. 28, 29, 30, 31A, 31B, 32, 33A, and 33B, illustrated is another embodiment implementing aspects of the method 100 of FIG. 1. The embodiment is illustrated by way of cross-sectional views of a device 2800 during various stages of production. The device 2800 may include a conductive word line (WL) of a device (e.g., memory device). FIGS. 28-33B may be fabricated according to steps described above with reference to the method 200 illustrated in FIG. 2.

Figure 28:
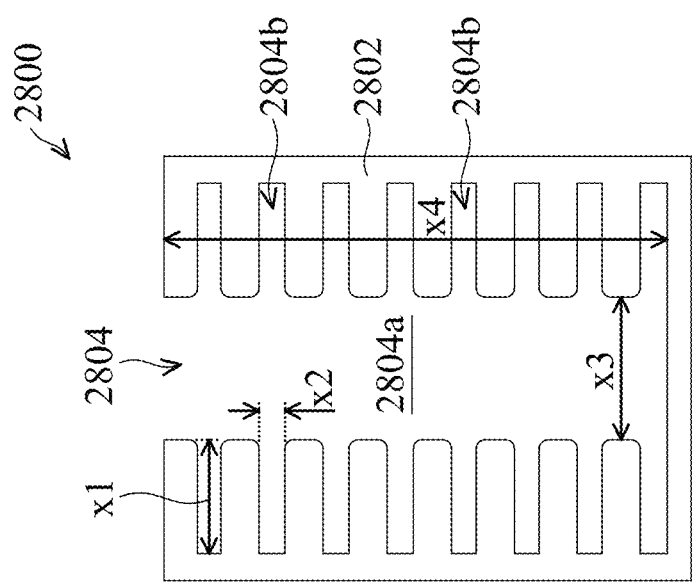

FIG. 28 illustrates a layer 2802 formed over a substrate (not shown) of the device 2800. The substrate may be substantially similar to as discussed above with reference to substrate 302 of FIG. 3. In an embodiment, the layer 2802 is a dielectric layer. In an embodiment, the dielectric layer 2802 may be substantially similar to the dielectric layer 304 discussed above with reference to FIG. 3. In an embodiment, the layer 2802 is an insulator such as SiN, $SiO_2$, TiN, $HfO_2$, $TiO_2$, SiCN, SiCO, SiCON, other metal oxide or HK material. An opening 2804 is formed in the layer 2802. The opening 2804 includes lateral spaces 2804b extending from a center opening 2804a providing a comb-like, cross-sectional view. Other geometries are also possible. In an embodiment, the opening 2804 may define a word line (WL) structure.

In an embodiment, the lateral spaces 2804b have a length x1. In an embodiment, the length x1 may be approximately 20 nanometers (nm) to approximately 200 nm. The lateral spaces 2804b may have a height x2. In an embodiment, the height x2 is between approximately 10 and 40 nm. The center opening 2804a may have a width of x3. In an embodiment, the width x3 is between approximately 20 and 40 nm. The opening 2804 may have a depth x4. In an embodiment, the depth x4 is between approximately 100 and 500 nm.

Figure 29:
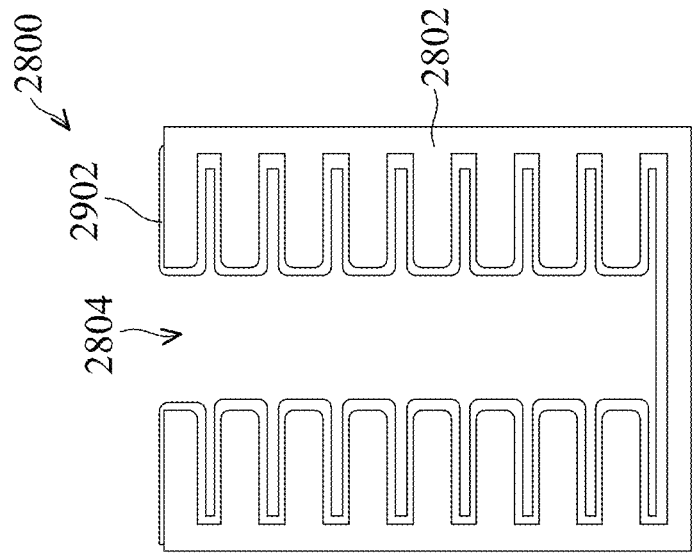
FIGS. 28, 29, 30, 31A, 31B, 32, 33A and 33B illustrate embodiment of the semiconductor structure according to a stage of operation in the method of FIG. 1, according to various aspects of the present disclosure.

As illustrated in FIG. 29, in an embodiment, a catalyst layer 2902 is formed on the surfaces of the opening 2804. The catalyst layer may be substantially similar to the catalyst formed in block 104 of the method 100 described with reference to FIG. 1, and/or the catalyst layer 308A of the method 200 described with reference to FIGS. 2 and 4A. In an example, the catalyst layer 2902 is a conformal layer. In an embodiment, the catalyst layer 2902 may be formed by ALD, CVD, ELD, PLAD, and/or other suitable processes. In an embodiment, the catalyst layer 2902 includes a metal selected from columns 8 to 12 of the period table, such as Pt, Pd, Co, Ru, Rh, Ag, Au, Cu, Ni, and/or combinations thereof.

Figure 30:
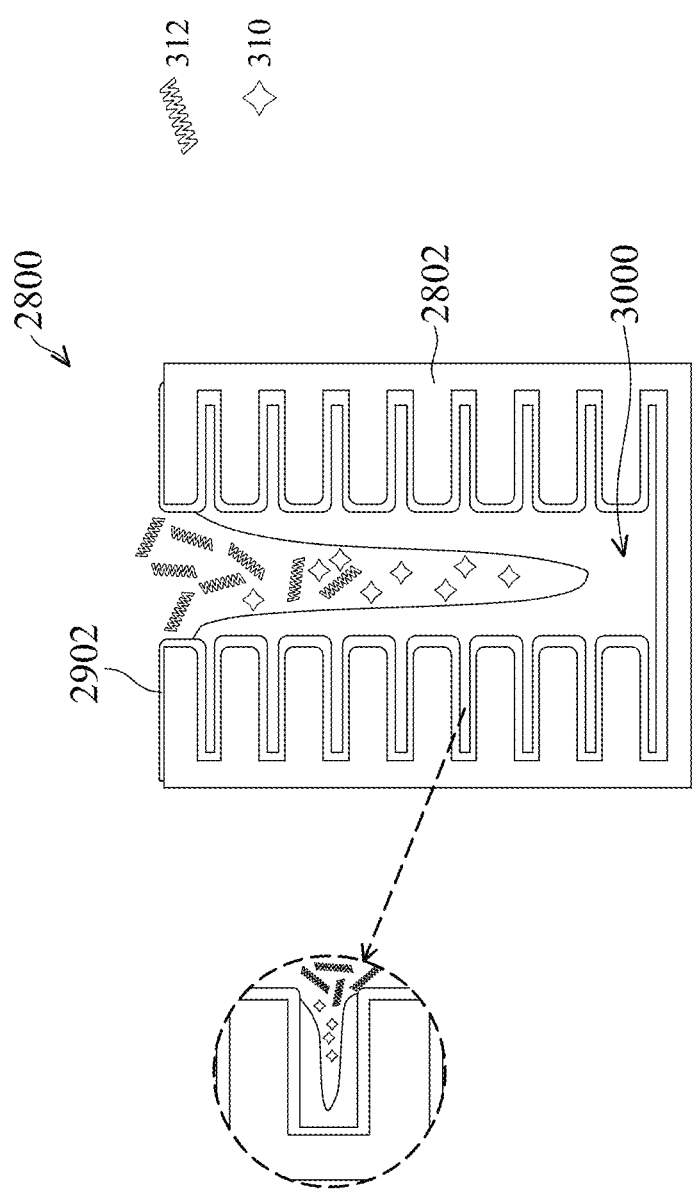

As discussed above with reference to block 208 of the method 200 in FIG. 2 and/or block 104 of the method 100 described with reference to FIG. 1, a selectivity enhancement process may be performed on the device 2800 after depositing the catalyst layer. In an embodiment, the selectivity enhancement process includes introduction of accelerator and/or suppressor components. FIG. 30 illustrates accelerator 310 and suppressor 312 are provided to the device 2800. In an embodiment, the accelerator 310 is SPS/MPS as discussed above. In an embodiment, the suppressor 312 is PEG, PPG, or a combination thereof as discussed above. The accelerator/suppressor components are provided during the metal deposition process (e.g., during ALD, CVD, PVD), for example, with the precursors for depositing the metal. In an embodiment, the accelerator/suppressor components provide for bottom-up growth and/or sidewall growth within the lateral spaces 2804b. FIG. 30 illustrates the device 2800 after some of the metal deposition 3000 has occurred providing a portion of a metal 3000 extending from a bottom of the opening 2804 and a portion of the metal 3000 filling the lateral spaces 2804b. Providing the selectivity enhancement process including the accelerator/suppressor may lead to conformal growth of the metal 3000 including enhancing the deposition rate on the bottom of the opening 2804 and enhancing the growth rate in lateral spaces 2804b.

Figure 33B:
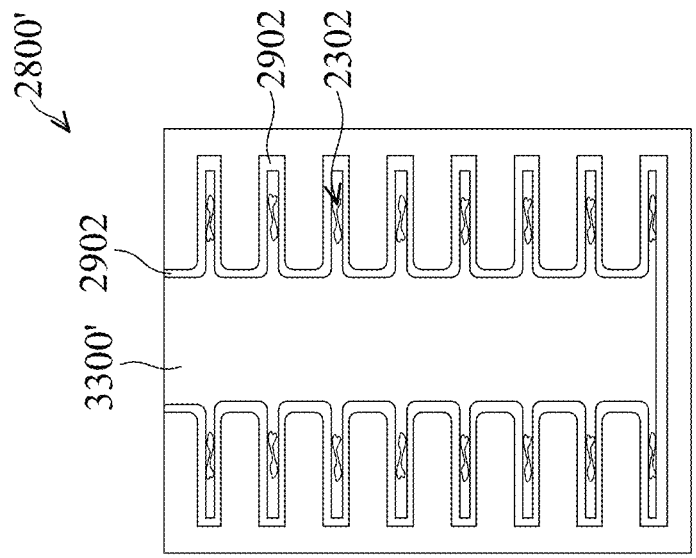
Figure 33A:
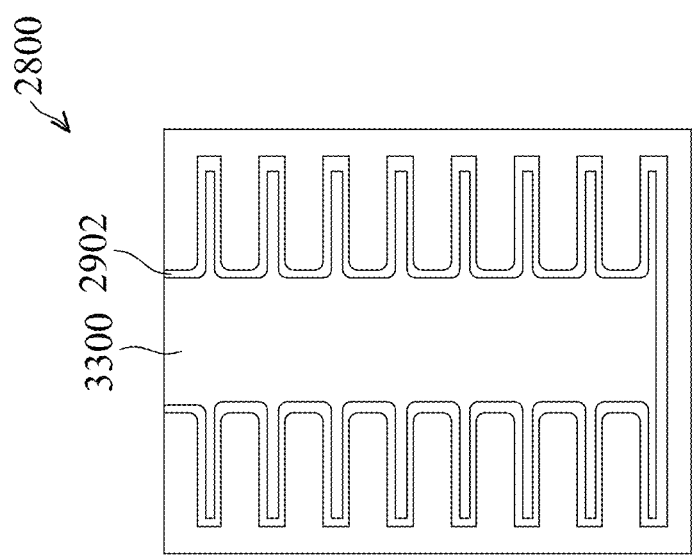

FIG. 33A illustrates the metal 3000 after filling an entirety of the opening 2804 to form metal feature 3300. FIG. 33B illustrates another embodiment of the metal 3000 after an entirety of the opening 2604 has been filled to form metal feature 3300', where seams 2302 are formed within lateral spaces 2804b of the opening 2804. It is noted that no seams 2302 are formed within the central portion 2804a in either the embodiment of metal feature 3300 or 3300'. The metal feature 3300 (and 3300') includes the catalyst layer 2902 and metal 3000. The metal feature 3300 (and 3300') may provide a WL.

Figure 31B:
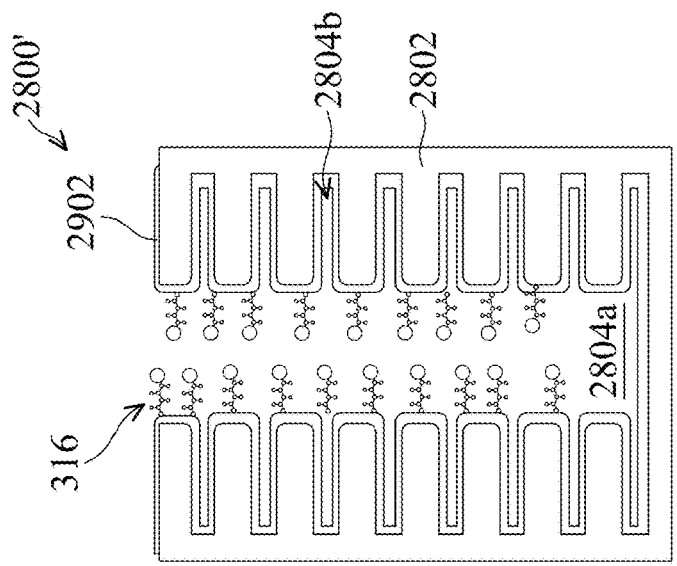
Figure 31A:
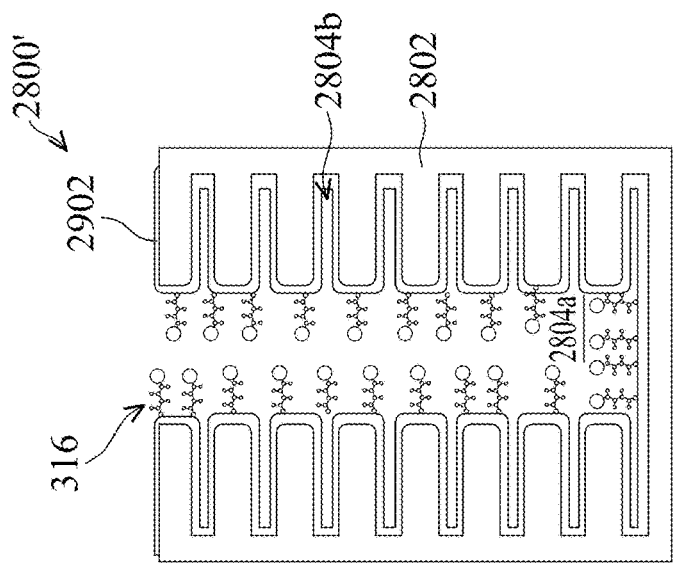

In an embodiment of the device 2800, the selectivity enhancement process includes introduction of a SAM in addition to or in lieu of the selectivity enhancement process of providing an accelerator/suppressor component(s). FIG. 31A illustrates SAM 316 is formed on the device 2800'. The SAM 316 may be substantially similar to as discussed above with reference to block 106 of the method 100. As discussed above, a process—deposition of SAM, tuning of SAM location, and deposition of metal—may be iteratively repeated until metal fills the opening 2804. FIG. 31A illustrates the deposition of the SAM 316. In some implementations, SAM 316 are not provided within the lateral space 2804b. FIG. 31B illustrates the tuning of the location of the SAM 316, for example, being removed from the bottom surface of the opening 2804a.

Figure 32:
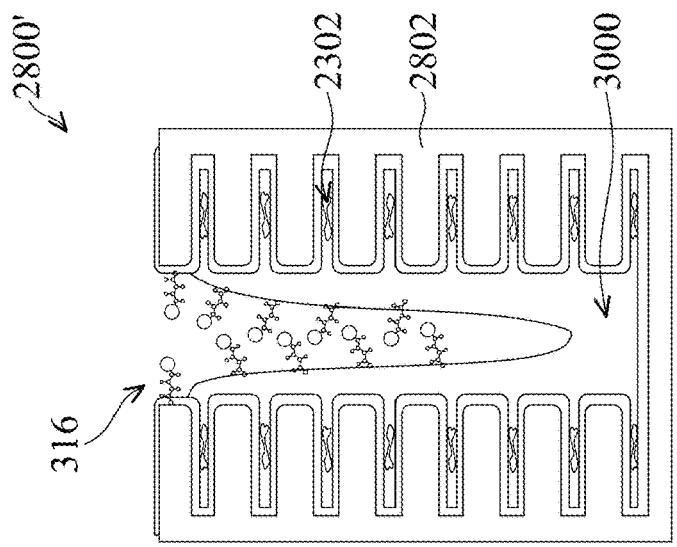

In an embodiment, SAM 316 after tuning allows for bottom-up growth of metal deposition within the opening 2804. In an embodiment, the SAM 316 after tuning allows for metal deposition within the lateral space 2804b. FIG. 32 illustrates the device 2800' after some of metal has been deposited filling a portion of the opening 2804, the partial deposition of metal 3000 extends from a bottom of the central portion 2804a and within the lateral spaces 2804b. The SAM 316 are formed on upper portions of the opening 2804 sidewalls to inhibit (or substantially prevent) deposition of the metal 3000 on the sidewalls. The SAM 316 may also be formed on the deposited metal 3000 to inhibit (or substantially prevent) additional metal deposition at the top region of the opening 2804a. The selectivity enhancement process may avoid creating vertically extending seams and/or seams within the opening 2804a.

Exemplary metal 3000 compositions include W, Mo, Pt, Pd, Co, Ru, Rh, Ag, Au, Cu, Ni, Fe or alloy like NiB, NiP, CoNiP, CoNiB, CoMnP, CoNiMnP, CoWP, CoWB, CoNiReP, CoB, CoP, CoFeB, CoNiFeB, FeP, and/or combinations thereof. In an embodiment, the metal 3000 is Mo.

FIG. 33A illustrates the device 2800 having the metal 3000 is deposited to substantially fill the opening 2804 to form metal feature 3300 (e.g., WL 3300). The metal feature 3300 includes the catalyst layer 2902 and metal 3000. In an embodiment, the metal feature 3300 is formed without a seam or void within the trench 2804 (see FIG. 33A). FIG. 33B illustrates the device 2800 having a metal feature 3300' substantially similar to the metal feature 3300 except providing seams 2302 within the lateral spaces 2804b.

In some implementations, the metal feature 3300, 3300' may further include a B, P, W, Sn, Mo, and/or other residue by-product. The residue may originate from the reducing agent such as HCHO, $N_2H_4$, DMAB, $H_2PO_2^-$, $BH_4^-$ solution found in deposition of the metal 3000. In some implementations, the metal feature 3300, 3300' may further include a residue between the catalyst layer 2902 and the metal 3000 such as C, S, O, N, Si, and/or other residues. The residue may originate from the accelerator and/or suppressor materials such as residues from SPS, MPS, PEG, PPG, and/or accelerator/suppressors as discussed above.

Although not intended to be limiting, one or more embodiments of the present disclosure provide many benefits to semiconductor structures and the formation thereof. In some embodiments, devices and methods are provided for enhancing the formation of conductive features, such as features formed by depositing metal into openings/trenches. By performing processes such as depositing a catalyst layer and/or selectivity enhancement processes, the conductive structures may provide a lower resistance by avoiding seams/voiding providing a uniform fill. Various semiconductor features may benefit from aspects of the present disclosure including but not limited to those specifically described in detail within the present disclosure. A CFET device implementing a GAA structure having a split gate device is one such embodiment. In a split gate device, any seams or voids in the deposited metal gate material risks unacceptable etched profile and depth variation during the etching back to form the split gate feature. Therefore, seam-free metal structure and methods of forming thereof is proposed to provide in some embodiments a controllable etch-back process. Methods combining catalyst layer formation and/or selectivity booster like SAM, accelerator and suppressor can provide a seam free metal gap fill in complex geometric structure.

The present disclosure provides for many different embodiments including semiconductor device structures and methods of fabrication thereof. In one exemplary aspect, a method is provided where the method includes depositing a catalyst layer along a surface of the opening and performing a selectivity enhancement process. The selectivity enhancement process alters a deposition rate of a metal component on at least one region of the catalyst layer. The metal component is deposited on the catalyst layer.

In a further embodiment, providing the opening includes removing a dummy gate structure to form the opening. Providing the opening may further comprise providing an alternating stack of channel layers and sacrificial layers and removing the sacrificial layers to provide a portion of the opening. In an embodiment, a gate dielectric layer is formed on the channel layers after removing the sacrificial layers and prior to depositing the catalyst layer. In an embodiment, performing the selectivity enhancement process includes providing at least one of an accelerator or a suppressor during the depositing the metal component. In an embodiment, performing the selectivity enhancement process includes: providing a self-assembled monolayer (SAM) over the surface of the opening; and tuning a location of the SAM to remove a portion of the SAM adjacent a bottom surface of the opening. In an embodiment, depositing the catalyst layer includes forming the catalyst layer conformally along a bottom surface and two opposing side surfaces of the opening.

In some implementations, depositing the catalyst layer includes forming the catalyst layer at a bottom of the opening. In an embodiment, the selectivity enhancement process includes forming a self-assembled monolayer (SAM), introducing an accelerator, or introducing a suppressor.

In another of the broader embodiments, a method is provided that includes forming a structure that includes a first fin structure including a channel region having a plurality of channel layers interleaved by a plurality of sacrificial layers. A source/drain region of the first fin structure is formed adjacent the channel region, and a dummy gate stack is formed over the channel region. The method further includes removing the dummy gate stack and the plurality of sacrificial layers in the channel region to form an opening. A catalyst layer is formed in the opening. A metal layer is deposited over the catalyst layer and in the opening. Depositing the metal layer includes performing a selectivity enhancement process introducing at least one of a self-assembled monolayer, accelerator components, or suppressor components.

In an implementation of the method, the method also includes etching back the metal layer to expose a subset of the plurality of channel layers; and forming another metal layer over the etched back metal layer. In an embodiment, the selectivity enhancement process includes providing at least one accelerator component of 3-mercaptopropylsulfonate (MPS). In yet another embodiment, the selectivity enhancement process includes providing the self-assembled monolayer (SAM), and wherein the providing the SAM includes depositing SAM and performing a plasma process to remove SAM from a bottom of the opening.

In an embodiment, before forming the catalyst layer and after removing the dummy gate stack, a gate dielectric layer is formed. The catalyst layer may be formed directly on the gate dielectric layer. In an embodiment, the catalyst layer is formed that includes depositing a material selected from groups 8 to 12 of the periodic table. In an embodiment, performing the selectivity enhancement process provides for bottom-up deposition of the metal layer within the opening.

In another of the broader embodiment, a semiconductor structure is provided. The structure includes a vertical stack of channel layers disposed over a substrate. The vertical stack may include a first plurality of channel layers, a middle layer over the first plurality of channel layers, and a second plurality of channel layers over the middle layer. A first gate structure wraps around each channel layer of the first plurality of channel layers and a second gate structure wraps around each channel layer of the second plurality of channel layers. The first gate structure is associated with a first transistor type and the second gate structure is associated with a second transistor type. The first gate structure includes a seam between a first channel layer and a second channel layer.

In an embodiment of the structure, the second gate structure is contiguous between a third channel layer and a fourth channel layer of the second plurality of channel layers. The contiguous second gate structure may be without a seam between the third and fourth channel layers. In an embodiment, a seam does not extend outside of a region confined by an imaginary vertical line extending coplanar with sidewalls of the first channel layer and the second channel layer. In an embodiment, the first gate structure includes a gate dielectric layer, a catalyst layer comprising a metal selected from groups 8 to 12 of the periodic table, and a work function metal on the catalyst layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing an opening above a semiconductor substrate;
   depositing a catalyst layer along a surface of the opening;
   performing a selectivity enhancement process, wherein the selectivity enhancement process alters a deposition rate of a metal component on at least one region of the catalyst layer; and
   depositing the metal component on the catalyst layer.

2. The method of claim 1, wherein the providing the opening includes:
   removing a dummy gate structure to form the opening.

3. The method of claim 2, wherein the providing the opening further includes:
   providing an alternating stack of channel layers and sacrificial layers; and
   removing the sacrificial layers to provide a portion of the opening.

4. The method of claim 3, further comprising:
   forming a gate dielectric layer on the channel layers after removing the sacrificial layers and prior to depositing the catalyst layer.

5. The method of claim 1, wherein the performing the selectivity enhancement process includes:
   providing at least one of an accelerator or a suppressor during the depositing the metal component.

6. The method of claim 1, wherein the performing the selectivity enhancement process includes:
providing a self-assembled monolayer (SAM) over the surface of the opening; and
tuning a location of the SAM to remove a portion of the SAM adjacent a bottom surface of the opening.

7. The method of claim 1, wherein the depositing the catalyst layer includes forming the catalyst layer conformally along a bottom surface and two opposing side surfaces of the opening.

8. The method of claim 1, wherein the depositing the catalyst layer includes forming the catalyst layer at a bottom of the opening.

9. The method of claim 1, wherein the performing the selectivity enhancement process includes forming a self-assembled monolayer (SAM), introducing an accelerator, or introducing a suppressor.

10. A method, comprising:
forming a structure including:
a first fin structure including a channel region having a plurality of channel layers interleaved by a plurality of sacrificial layers,
a source/drain region of the first fin structure adjacent the channel region, and
a dummy gate stack over the channel region;
removing the dummy gate stack and the plurality of sacrificial layers in the channel region to form an opening;
forming a catalyst layer in the opening;
depositing a metal layer over the catalyst layer and in the opening, wherein the depositing the metal layer includes performing a selectivity enhancement process introducing at least one of a self-assembled monolayer, accelerator components, or suppressor components.

11. The method of claim 10, further comprising:
etching back the metal layer to expose a subset of the plurality of channel layers; and
forming another metal layer over the etched back metal layer.

12. The method of claim 10, wherein the selectivity enhancement process includes providing at least one accelerator component of 3-mercaptopropylsulfonate (MPS).

13. The method of claim 10, wherein the selectivity enhancement process includes providing the self-assembled monolayer (SAM), and wherein the providing the SAM includes depositing SAM and performing a plasma process to remove SAM from a bottom of the opening.

14. The method of claim 10, further comprising:
before forming the catalyst layer and after removing the dummy gate stack, forming a gate dielectric layer, wherein the catalyst layer is formed directly on the gate dielectric layer.

15. The method of claim 10, wherein the forming the catalyst layer includes depositing a material selected from groups 8 to 12 of the periodic table.

16. The method of claim 10, wherein the performing the selectivity enhancement process provides for bottom-up deposition of the metal layer within the opening.

17. A method of fabricating a semiconductor structure, the method comprising:
providing a vertical stack of channel layers disposed over a substrate, wherein the vertical stack includes a first plurality of channel layers, a middle layer over the first plurality of channel layers, and a second plurality of channel layers over the middle layer;
forming a first gate structure wrapping around each channel layer of the first plurality of channel layers and a second gate structure wrapping around each channel layer of the second plurality of channel layers, wherein the first gate structure is associated with a first transistor type and the second gate structure is associated with a second transistor type, wherein forming the first gate structure includes making a seam between a first channel layer and a second channel layer.

18. The method of fabricating the semiconductor structure of claim 17, wherein forming the second gate structure includes making the second gate structure between a third channel layer and a fourth channel layer of the second plurality of channel layers, wherein the second gate structure is without any seam between the third and fourth channel layers.

19. The method of fabricating the semiconductor structure of claim 17, wherein the forming the first gate structure does not form the seam extending outside of a region confined by an imaginary vertical line extending coplanar with sidewalls of the first channel layer and the second channel layer.

20. The method of fabricating the semiconductor structure of claim 17, wherein the forming the first gate structure includes:
depositing a gate dielectric layer;
depositing a catalyst layer comprising a metal selected from groups 8 to 12 of the periodic table after the gate dielectric layer; and
depositing a work function metal on the catalyst layer.

* * * * *